(12) United States Patent
Masuda

(10) Patent No.: US 6,358,782 B1
(45) Date of Patent: Mar. 19, 2002

(54) METHOD OF FABRICATING A SEMICONDUCTOR DEVICE HAVING A SILICON-ON-INSULATOR SUBSTRATE AND AN INDEPENDENT METAL ELECTRODE CONNECTED TO THE SUPPORT SUBSTRATE

(75) Inventor: Takashi Masuda, Tokorozawa (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/635,690

(22) Filed: Aug. 10, 2000

Related U.S. Application Data

(62) Division of application No. 09/420,531, filed on Oct. 19, 1999, now abandoned.

(30) Foreign Application Priority Data

Oct. 20, 1998 (JP) ............................................. 10-297865

(51) Int. Cl.⁷ .................... H01L 21/00; H01L 21/84; H01L 21/44
(52) U.S. Cl. ...................... 438/149; 438/151; 438/153; 438/597
(58) Field of Search .................................. 438/149, 151, 438/153, 597, 618, 620, 666, 667, 311

(56) References Cited

U.S. PATENT DOCUMENTS

| | | | | |
|---|---|---|---|---|
| 4,755,482 A | * | 7/1988 | Nagakubo | 438/151 |
| 4,996,575 A | * | 2/1991 | Ipri et al. | 257/369 |
| 5,198,379 A | * | 3/1993 | Adan | 438/151 |
| 5,314,841 A | * | 5/1994 | Brady et al. | 438/517 |
| 5,689,136 A | | 11/1997 | Usami | 257/679 |
| 6,096,581 A | * | 8/2000 | Zhang et al. | 438/149 |

* cited by examiner

Primary Examiner—Matthew Smith
Assistant Examiner—Lex H. Malsawma
(74) Attorney, Agent, or Firm—Armstrong, Westerman & Hattori, LLP.

(57) ABSTRACT

A plurality of semiconductor components (33, 35) isolated by an insulating film (39) are formed on a buried oxidation film (3) of an SOI substrate (1), substrate contact holes (5, 6) through the insulating film (39) and the buried oxidation film (3) are provided, a heavily doped diffusion layer (7) is provided in the vicinity of the surface of a support substrate (2) exposed within the substrate contact holes (5, 6), and a metal electrode (22) with a pad portion (22a) extending onto the insulating film (39) electrically connected with the heavily doped diffusion layer (7) through the substrate contact holes (5, 6) is provided.

9 Claims, 21 Drawing Sheets

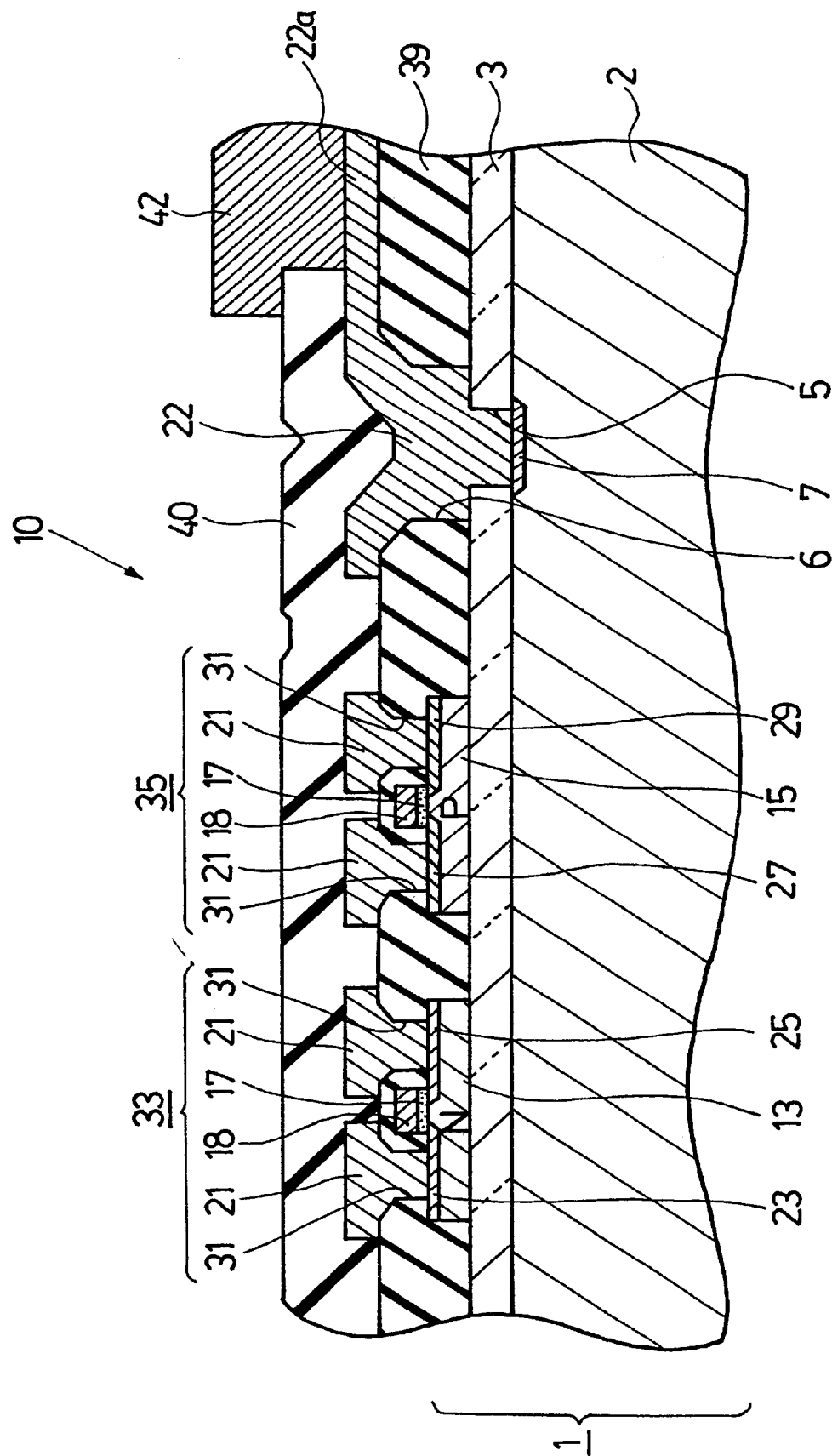

F I G. 1 2
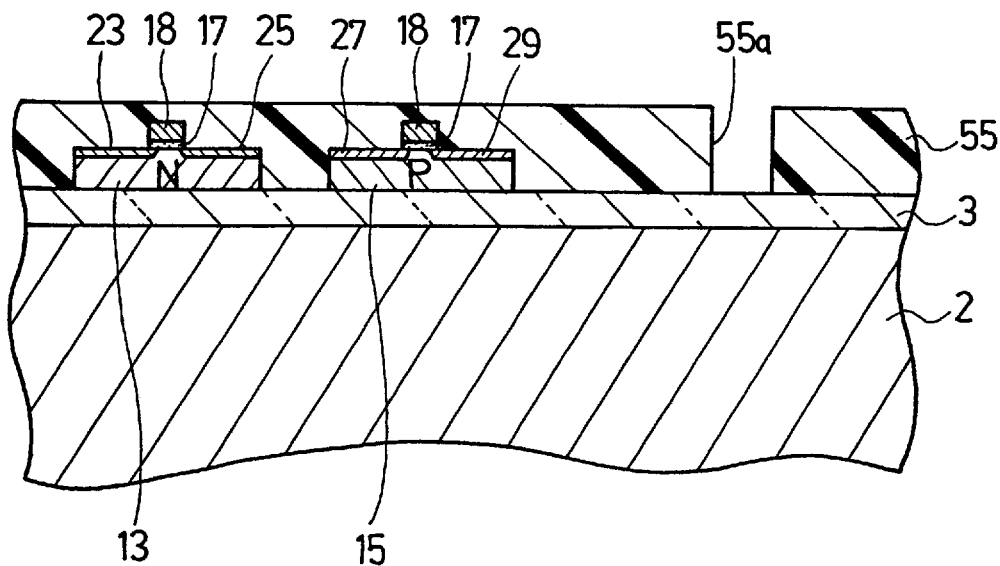
F I G. 1 3
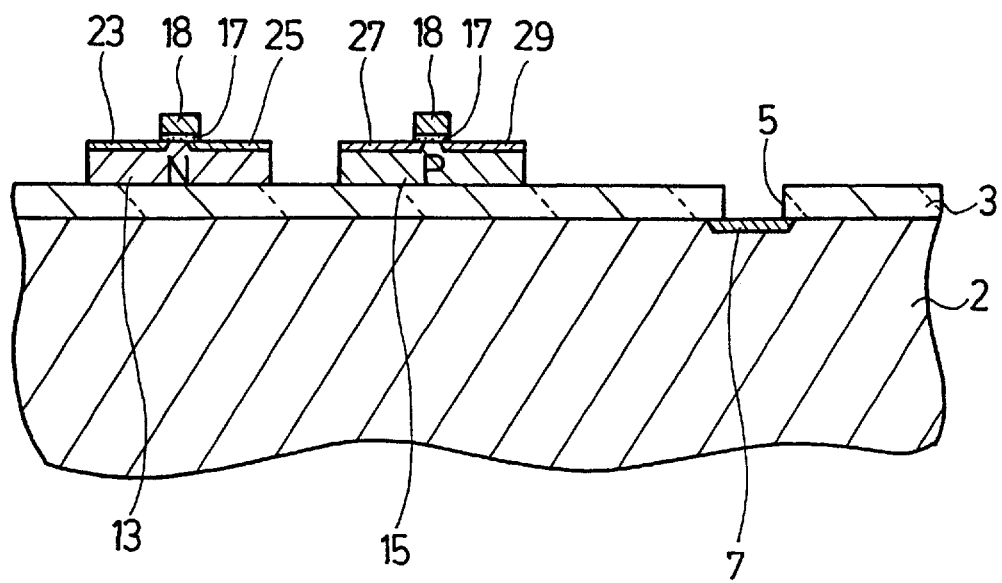

US 6,358,782 B1

METHOD OF FABRICATING A SEMICONDUCTOR DEVICE HAVING A SILICON-ON-INSULATOR SUBSTRATE AND AN INDEPENDENT METAL ELECTRODE CONNECTED TO THE SUPPORT SUBSTRATE

This application is a division of prior application Ser. No. 09/420,531 filed Oct. 19, 1999, now abandoned.

BACKGROUND OF THE INVENTION

1. Field of the Invention

The present invention relates to a semiconductor device using an SOI (Silicon On Insulator) in which a buried oxidation film and a surface silicon layer are provided on a support substrate made of silicon and a plurality of semiconductor components are formed on the buried oxidation film, and to a method of fabricating the same.

2. Description of the Related Art

The SOI substrate is a substrate that a buried oxidation film and a surface silicon layer are formed on a support substrate made of silicon. The semiconductor device fabricated using such SOI substrate has a lot of advantages compared with a semiconductor device fabricated with bulk silicon. For instance, these advantages are in that the semiconductor device with the SOI substrate has high resistance to temperature and radiation, capability of realizing quick operation with ease, low power consumption, and so on.

Hereinafter, the structure of a semiconductor device using a conventional SOI substrate will be described with FIG. 36.

FIG. 36 is a sectional view showing the enlarged principal portion of an IC chip which is the semiconductor device using the conventional SOI substrate.

In an SOI substrate 1, a buried oxidation film 3 is provided on a support substrate 2 made of silicon and a surface silicon layer is provided on the buried oxidation film 3. However, in FIG. 36, the surface silicon layer is etched to form into a plurality of island-shape component regions and impurities are implanted into each component region and diffused to form a lightly doped N region 13 and a lightly doped P region 15.

A P channel field effect transistor (hereinafter referred to as "a P channel FET") 33 and an N channel field effect transistor (hereinafter referred to as "an N channel FET") 35 are provided respectively on the lightly doped N region 13 and the lightly doped P region 15 isolated from each other by an insulating film 39.

In the P channel FET 33, a gate electrode 18 is formed above the center of the lightly doped N region 13 with a gate oxidation film 17 therebetween, and a P drain layer 23 and a P source layer 25 are formed respectively on either side of the gate electrode 18. The gate electrode 18, the P drain layer 23, and the P source layer 25 are respectively provided with metal electrodes (interconnection electrodes) 21 extending onto the insulating film 39 through contact holes 31.

In the N channel FET 35, a gate electrode 18 is formed above the center of the lightly doped P region 15 with a gate oxidation film 17 therebetween, and an N drain layer 27 and an N source layer 29 are formed respectively on either side of the gate electrode 18. The gate electrode 18, the N drain layer 27, and the N source layer 29 are also respectively provided with metal electrodes (interconnection electrodes) 21 extending onto the insulating film 39 through contact holes 31.

Incidentally, since the metal electrodes (interconnection electrodes) connecting with the gate electrodes 18 of the P channel FET 33 and the N channel FET 35 are respectively provided at positions in a section different from FIG. 36, they are not shown in FIG. 36.

Moreover, pad portions for providing input/output terminals are formed at the metal electrodes 21 connecting with the outside out of a number of metal electrodes 21 through the illustration thereof is omitted.

Though the P channel FET 33 and the N channel FET 35 are inverse in conduction type of the lightly doped region, the drain layer, and the source layer, they have a common basic structure. The pair of P channel FET 33 and N channel FET 35 constitute a CMOS transistor.

A passivation film 40 is provided on the entire top face of the IC chip except for the pad portions as a protection film.

In FIG. 36, only one pair of CMOS transistors is shown, but a number of CMOS transistors, other FETs, bipolar transistors, resistors, or capacitors are provided in an IC chip in use. All of these are, of course, made by the SOI technology.

When the IC chip which is the semiconductor device using the aforesaid SOI substrate is operated, it is necessary to take notice that the support substrate must be grounded or biased. For instance, the support substrate 2 needs to be grounded or biased in a case of the IC chip shown in FIG. 36. Thereby, the operation of the IC chip can be stabilized.

The above is important for a problem when the IC chip is mounted on a lead frame, a circuit board, or the like of a package.

There are two kinds of methods of mounting the IC chip, broadly divided into the face up mounting method and the face down mounting method.

The face up mounting method means that the IC chip is mounted on a mounting substrate such as a lead frame, a circuit board or the like of a package with the component face of the IC chip placed upward, and terminals (conducting to the aforesaid pad portions) provided on the component face of the IC chip and terminals on the mounting substrate side are connected by wire bonding.

The face down mounting method means that bumps or the like which are projections conducting to the aforesaid pad portions are formed on the component face of the semiconductor IC chip, and the face is placed downward directly contacting lead electrodes (conduction patterns) on the mounting substrate to be electrically connected and adhered.

According to the face up mounting method, the rear face (the side opposite to the component face) of the IC chip, that is, the rear face of the support substrate can be electrically connected with the grounded portion on the mounting substrate. Accordingly, in a case of the IC chip shown in FIG. 36, the support substrate 2 can be electrically and preferably connected with the grounded portion on the mounting substrate side to ground by adding a step for obtaining an excellent electrical contact with the grounded portion on the mounting substrate side on the rear side of the support substrate 2 of the SOI substrate 1.

However, according to the above mounting method, there is a problem that the potential of the support substrate of the IC chip is limited to the ground potential on the mounting substrate side. Accordingly, in the IC chip using the SOI substrate, even though a multi-power circuit capable of properly using a plurality of voltages can be constituted, the bias voltage of the support substrate can not be set freely, therefore there is a problem that the advantage of the multi-power circuit is not taken.

Further, in the face down mounting method, since the rear surface of the support substrate and the lead electrode formation face of the mounting substrate such as a lead frame or the like are not in contact with each other, it is difficult for the support substrate to be biased or grounded and it is hard to obtain an electrical contact between the mounting substrate and the support substrate. Therefore, there is a problem that the potential of the support substrate gets into a floating state.

SUMMARY OF THE INVENTION

The present invention is made to solve the aforesaid problem when a semiconductor device (an IC chip) with an SOI substrate is used, and its object is to make a support substrate of the semiconductor device with the SOI substrate easily grounded or biased by any mounting method.

To achieve the above object in this invention, as descried above, the semiconductor device in which a plurality of semiconductor components isolated from each other by an insulating film are provided on a buried oxidation film of the SOI substrate that the buried oxidation film is provided on the support substrate made of silicon is structured as following. Moreover, the present invention also provides the method of easily fabricating the semiconductor device.

More specifically, in the semiconductor device according to the present invention, a substrate contact hole through the insulating film and the buried oxidation film is provided at a region isolated from each semiconductor component by the insulating film, and a heavily doped diffusion layer of which the conduction type is the same as that of the support substrate is formed in the surface of the support substrate within an opening made by the substrate contact hole. A metal electrode filled in the substrate contact hole to be electrically connected with the heavily doped diffusion layer with a pad portion extending onto said insulating film is provided.

In the semiconductor device according to the present invention, since the pad portion of the metal electrode electrically connected with the support substrate through the heavily doped region is provided on the component face, the support substrate can be easily grounded or biased by connecting the pad portion to a connecting terminal or a lead electrode on the mounting substrate side when the semiconductor device is mounted on the mounting substrate such as a lead frame or the like.

In the above semiconductor device, it is preferable to be provided with a protection film for covering each semiconductor component and a connecting electrode connecting with the pad portion from the top of the protection film through an opening provided in the protection film.

When the support substrate forms into a square or a rectangle, the connecting electrode is preferably arranged along the periphery of the support substrate.

Moreover, a difference in depth level is provided in the substrate contact hole by making the opening in the insulating film forming the substrate contact hole larger than the opening in the buried oxidation film, thereby enhancing adherence of the metal electrode made of aluminum or the like.

In the above semiconductor device, the plurality of semiconductor components are made to be field effect transistors of single drain type in which gate electrodes, drain layers and source layers on both sides of the gate electrodes are formed above a plurality of component regions made of a surface silicon layer of the SOI substrate respectively with gate oxidation films therebetween, and the gate electrodes, the drain layers, and the source layers are respectively provided with metal electrodes extending onto the protection film.

Alternatively, the plurality of the semiconductor components may be field effect transistors having side walls on both sides of the gate electrodes and lightly doped drain layers are formed under the side walls.

Further, the plurality of the semiconductor components may be field effect transistors in which offset regions are provided between the gate electrodes and the drain layers.

A method of fabricating a semiconductor device according to the present invention is the method of fabricating the aforesaid semiconductor device according to the present invention and has the following steps.

(1) An SOI substrate in which a surface silicon layer is formed above a support substrate made of silicon with a buried oxidation film therebetween is prepared.

(2) A plurality of independent component regions made of the surface silicon layer are formed by selectively etching the surface silicon layer of the SOI substrate.

(3) A plurality of lightly doped P regions or N regions are formed by selectively ion-implanting impurity atoms of which the conduction type is P-type or N-type into the plurality of the component regions.

(4) The impurity atoms in each lightly doped P or N region are diffused by heat treatment.

(5) A gate electrode is formed on each lightly doped P or N region with a gate oxidation film therebetween.

(6) A drain layer and a source layer are formed by selectively ion-implanting impurity atoms of which the conduction type is opposite to that of the lightly doped P or N region into both sides of the gate electrode of each lightly doped P or N region.

(7) A substrate contact hole is formed on the support substrate by selectively etching the buried oxidation film.

(8) A heavily doped diffusion layer is formed by ion-implanting impurity atoms of which the conduction type is the same as that of the support substrate into a portion of the support substrate exposed within the substrate contact hole.

(9) A component contact hole is formed at a position independently corresponding to each gate electrode, drain layer, and source layer of each component region by forming an insulating film on the entire top face of the support substrate and thereafter performing photo-etching treatment, a forming a contact hole also at a position corresponding to the substrate contact hole.

(10) An independent metal electrode is formed for each contact hole by forming a metal electrode layer on the entire top face of the insulating film and in all the contact holes and thereafter performing photo-etching treatment, and simultaneously forming a pad portion extending onto the insulating film at the metal electrode formed in the substrate contact hole (a step of forming a metal electrode).

Alternatively, the step (6) can be replaced with the following each step.

A lightly doped drain layer is formed by selectively ion-implanting impurity atoms of which the conduction type is opposite to that of the lightly doped P or N region into both sides of the gate electrode of each lightly doped P or N region.

Side walls made of silicon oxidation film are formed on both side faces of each gate electrode.

A drain layer and a source layer are formed by selectively ion-implanting impurity atoms of which the conduction type is the same as that of the lightly doped drain layer into regions outside the side walls on both sides of the gate electrode of each lightly doped P or N region.

Further, the step (6) may be replaced with the following each step.

An offset region is formed by selectively ion-implanting impurity atoms of which the conduction type is opposite to that of the lightly doped P or N region into one side of the gate electrode of each lightly doped P or N region;

The impurity atoms in the offset region are diffused by performing heat treatment.

A drain layer and a source layer are formed by selectively ion-implanting impurity atoms of which the conduction type is the same as that of the offset region into regions on both sides of the gate electrode of each lightly doped P or N region except for the offset region.

In such method of fabricating the semiconductor device, it is preferable that a protection film is formed on the entire top face of the insulating film and each metal electrode, an opening is formed at a position in the protection film corresponding to the pad portion after the step of forming the metal electrode, and a connecting electrode connecting with the pad portion from the top of the protection film through the opening is formed.

Moreover, in the step (9) above described, it is preferable that a contact hole larger than the substrate contact hole is formed at a position corresponding to the substrate contact hole when the contact hole is formed in the step of forming the contact hole in the insulating film.

The above and other objects, features and advantages of the invention will be apparent from the following detailed description which is to be read in conjunction with the accompanying drawings.

BRIEF DESCRIPTION OF THE DRAWINGS

FIG. 1 is a schematic sectional view showing the enlarged principal portion of a first embodiment of a semiconductor device according to the present invention;

FIG. 2 through FIG. 21 are schematic sectional views, similar to FIG. 1, showing each step for explaining a first embodiment of a fabricating method of the semiconductor device according to the present invention;

DETAILED DESCRIPTION OF THE PREFERRED EMBODIMENTS

Hereinafter the preferred embodiments of the present invention will be described with reference to the drawings.

First Embodiment of a Semiconductor Device: FIG. 1

First, the first embodiment according to the present invention will be described with FIG. 1. FIG. 1 is a schematic sectional view showing the enlarged principal portion of the semiconductor device. In FIG. 1, the same numerals and symbols are given to portions corresponding to those of the conventional example shown in FIG. 36.

Figure 36:
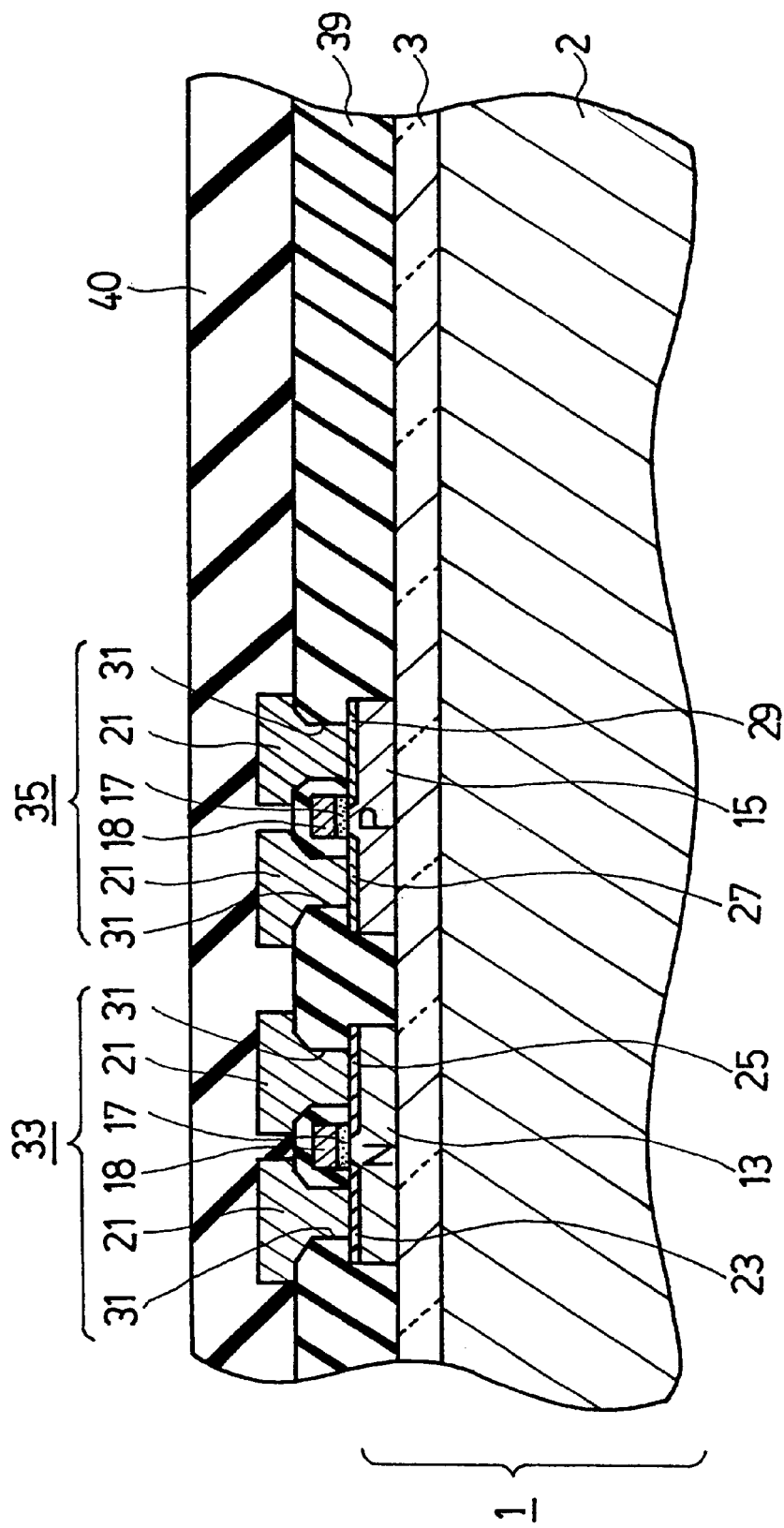
FIG. 36 is a schematic sectional view showing the enlarged principal portion of an example of a conventional semiconductor device.

A semiconductor device 10 shown in FIG. 12 is an IC chip using an SOI substrate 1 in which a buried oxidation film 3 is provided on a support substrate 2 made of silicon and a surface silicon layer is provided on the buried oxidation film 3 in the same manner as in the conventional semiconductor device described with FIG. 36, and a P channel FET 33 and an N channel FET 35 which are a plurality of semiconductor components isolated from each other by an insulating film 39 are provided on the buried oxidation film 3.

The buried oxidation film 3 provided on the support substrate 2 of the SOI substrate 1 has a thickness of about 0.1 $\mu$m to 1 $\mu$m and the surface silicon layer with a thickness of about 0.1 $\mu$m to 5 $\mu$m is provided on the buried oxidation film 3. However, in FIG. 1, the surface silicon layer is etched to form into a plurality of island-shape component regions and impurities are implanted into each component region and diffused to form a lightly doped N region 13 and a lightly doped P region 15.

In the P channel FET 33, a gate electrode 18 is formed above the center on the lightly doped N region 13 with a gate oxidation film 17 therebetween, and a P drain layer 23 and a P source layer 25 are formed respectively on either side thereof. The gate electrode 18, the P drain layer 23, and the P source layer 25 are respectively provided with metal electrodes (interconnection electrodes) 21 extending onto the insulating film 39 through contact holes 31.

In the N channel FET 35, a gate electrode 18 is formed above the center on the lightly doped P region 15 with a gate oxidation film 17 therebetween, and an N drain layer 27 and an N source layer 29 are formed respectively on either side thereof. The gate electrode 18, the N drain layer 27, and the N source layer 29 are also respectively provided with metal electrodes (interconnection electrodes) 21 extending onto the insulating film 39 through contact holes 31.

Incidentally, since the metal electrodes (interconnection electrodes) connecting with the gate electrodes 18 in the P channel FET 33 and the N channel electrode 35 are respectively provided at positions in a section different from FIG. 1, they are not shown in FIG. 1.

Moreover, pad portions for providing input/output terminals are formed at the metal electrodes 21 connecting with the outside out of a number of metal electrodes 21 though the illustration thereof is omitted.

Phosphorus atoms are used for impurities in the lightly doped N region 13, the N drain layer 27, and the N source layer 29, and boron atoms are used for impurities in the lightly doped P region 15, the P drain layer 23, and the P source layer 25. Polycrystalline silicon is used for the gate electrode 18.

Though the P channel FET 33 and the N channel FET 35 are inverse in conduction type of the lightly doped region, the drain layer, and the source layer, they have a common basic structure. The pair of P channel FET 33 and N channel FET 35 constitute a CMOS transistor.

In FIG. 1, only one pair of CMOS transistors is shown, but a number of CMOS transistors, other FETs, bipolar transistors, resistors or capacitors are provided in an IC chip in use. The above structure is the same as that of the conventional example described with FIG. 36.

In the semiconductor device 10, the following two points are different from those in the conventional semiconductor device shown in FIG. 36:

A substrate contact hole 5 is formed in the buried oxidation film 3 within a region isolated from the P channel FET 33 and the N channel FET 35 by the insulating film 39, and a contact hole 6 which is larger than the substrate contact hole 5 is formed at a position corresponding to the substrate contact hole 5 through the insulating film 39. The contact hole 6 in the insulating film 39 also constitutes the substrate contact hole.

A heavily doped diffusion layer 7 which has the same conduction type as the support substrate is formed in the surface of the support substrate 2 within an opening made by the substrate contact hole 5, and a metal electrode 22 made of aluminum filled in the substrate contact hole 5 and the contact hole 6 to be electrically connected with the heavily doped diffusion layer 7 with a pad portion 22a extending onto the insulating film 39 is provided.

The heavily doped diffusion layer 7 is made by implanting and diffusing boron atoms of P impurities if the conduction type of the support substrate 2 is P-type, or phosphorus atoms of N impurities if the conduction type of the support substrate 2 is N-type.

In this embodiment, a passivation film 40 is further provided as a protection film for covering the P channel FET 33 and the N channel FET 35 each of which is a semiconductor component, and the metal electrodes 21 and 22. A connecting electrode 42 connecting with the pad portion 22a from the top of the insulating film 39 through an opening 40a provided in the passivation film 40 is provided.

The contact hole 6 in the insulating film 39 is formed to be larger than the substrate contact hole 5 in the buried oxidation film 3 so as to form the whole inner periphery of the substrate contact hole into a step-shape for the purpose of enhancing adherence when the metal electrode 22 is formed by spattering aluminum.

The semiconductor device (IC chip) 10 is provided with the pad portion 22a and the connecting electrode 42 on the component face (the face on the upper side in FIG. 1), which are electrically connected with the support substrate 2 through the metal electrode 22 and the heavily doped diffusion layer 7.

Accordingly, even if the semiconductor device 10 is mounted by either of the face up mounting method and the face down mounting method onto a mounting substrate such as a lead frame or the like, the pad portion 22a of the metal electrode 22 or the connecting electrode 42 can be electrically connected with a terminal or a lead electrode on the mounting substrate side. Thereby, the support substrate 2 of the semiconductor device 10 can be grounded or set at any bias, which can easily stabilize operation of the semiconductor device 10.

Also in a case where the conventional semiconductor device (IC chip) is mounted by the face up mounting method, the support substrate can be grounded through the lead electrode or the like on the mounting substrate side with an additional step for forming an excellent electrical contact on the rear face of the support substrate. However, it is unnecessary to add such step for the aforesaid semiconductor device 10 according to the present invention. More than that, the potential of the support substrate 2 is referred to the potential from the outside to which the support substrate 2 is connected through the metal electrode 22 without being restricted by the ground potential of a package thereof, which enables multi-power driving for properly using a plurality of voltages, thereby taking advantages of the semiconductor device fabricated by using an SOI substrate.

Also in a case where the semiconductor device 10 is mounted by the face down method, the support substrate 2 can be easily grounded or biased, thus the potential of the support substrate can be stabilized, thereby avoiding a floating state.

First Embodiment of a Method of Fabricating the Semiconductor Device: FIG. 2 Through FIG. 21

Next, as the first embodiment of the method of fabricating the semiconductor device according to the present invention, the method for fabricating the semiconductor device shown in FIG. 1 will be described using FIG. 2 through FIG. 21. FIG. 2 through FIG. 21 are schematic sectional views showing the state in each step in order to explain the method of fabricating the semiconductor device, and they are shown with the size thereof being somewhat scaled down as compared with the semiconductor device shown in FIG. 1.

Figure 2:
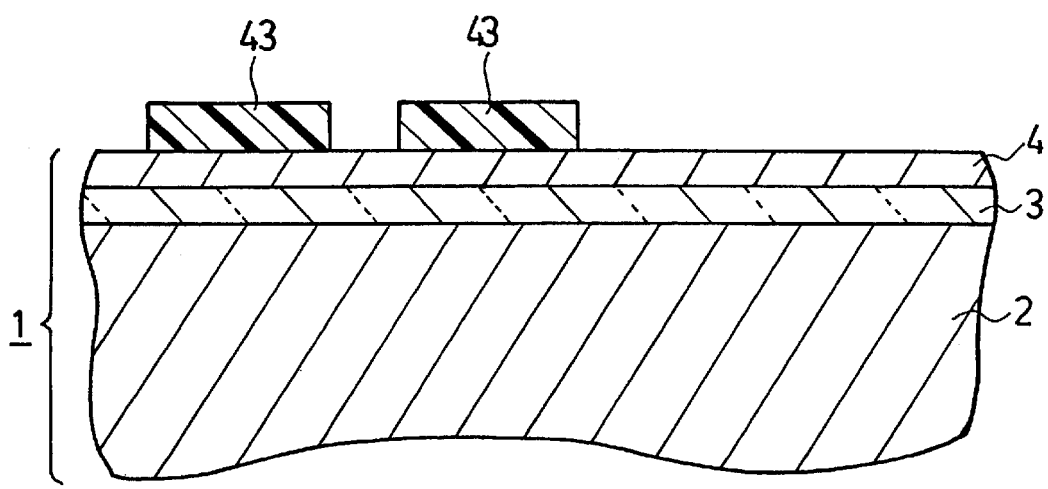

First, as shown in FIG. 2, the SOI substrate 1 provided with the buried oxidation film 3 having a thickness of 0.1 $\mu$m to 1 $\mu$m on the support substrate 2 made of silicon and with the surface silicon layer 4 having a thickness of about 0.1 $\mu$m to 5 $\mu$m on the buried oxidation film 3 is prepared for use.

Then, the P channel FET 33 and the N channel FET 35 which are semiconductor components shown in FIG. 1 are formed on the SOI substrate 1 as the following.

First, a photoresist is applied on the entire top face of the surface silicon layer 4 of the SOI substrate 1 by the spin coating and then exposed and developed using a predetermined photomask to be patterned so as to leave a photoresist 43 only within the component regions, as shown in FIG. 2, where a plurality of semiconductor components are formed.

Figure 3:
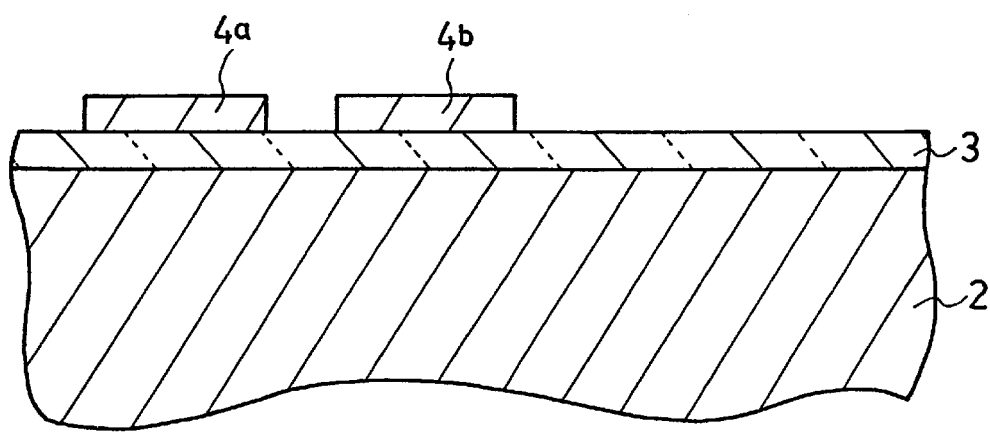

Sequentially, the surface silicon layer 4 is selectively etched in such a manner that a portion thereof which is not covered with the photoresist 43 is completely removed. This etching is performed by the reactive ion etching using carbon tetrafluoride ($CF_4$), chlorine ($Cl_2$), and helium (HE) as reactive gas. Thereafter, when the photoresist 43 is removed using sulfuric acid ($H_2SO_4$), island-shape surface silicon layers 4a and 4b remain only within component regions on the buried oxidation film 3, as shown in FIG. 3, where the semiconductor components are formed.

Figure 4:
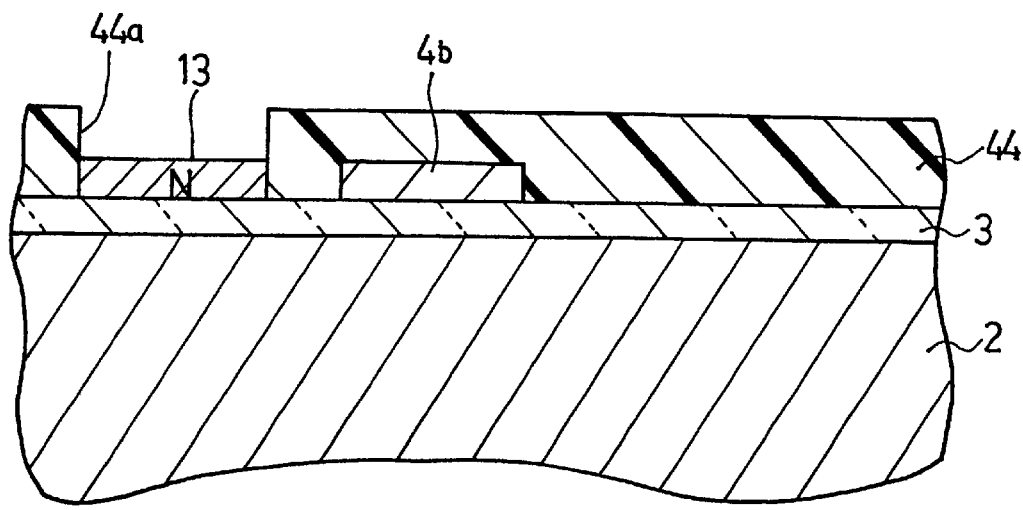

Then, a photoresist is applied on the entire top face of the buried oxidation film 3 by the spin coating and exposed and developed using a predetermined photomask in such a manner that a photoresist 44 is patterned to form an opening 44a above the surface silicon layer 4a within the component region, as shown in FIG. 4, where the P channel FET is formed.

Sequentially, using the photoresist 44 as an ion implantation barrier film, N impurities (not shown) are selectively ion-implanted into the surface silicon layer 4a within the component region under conditions in the order of 50 keV in implantation energy and $1\times10^{12}$ $cm^{-2}$ in implantation dose, thereby making the surface silicon layer 4a into the lightly doped N region 13. Incidentally, phosphorus atoms are used as the N impurities in this case. Then, the photoresist 44 is removed with sulfuric acid.

Figure 5:
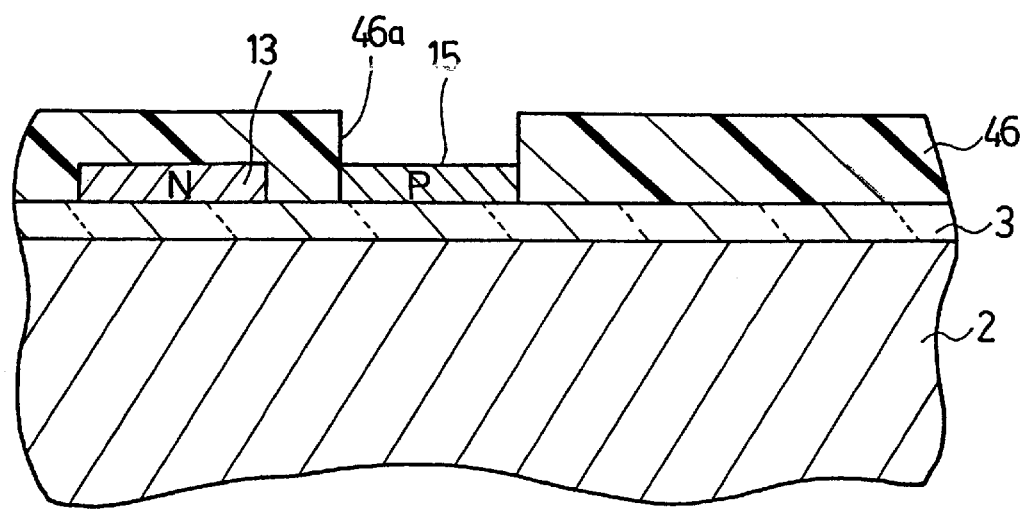

Next, a photoresist is again applied on the entire top face of the buried oxidation film 3 by the spin coating and exposed and developed using a predetermined photomask in such a manner that a photoresist 46 is patterned to form an opening 46a above the surface silicon layer 4b within the component region, as shown in FIG. 5, where the N channel FET is formed.

Then, using the photoresist 46 as an ion implantation barrier film, P impurities (not shown) are selectively ion-implanted into the surface silicon layer 4b within the component region under conditions in the order of 50 keV in implantation energy and $1\times10^{12}$ $cm^{-2}$ in implantation dose, thereby making the surface silicon layer 4b into the lightly doped P region 15. Incidentally, boron atoms are used as the P impurities in this case. Then, the photoresist 46 is removed with sulfuric acid.

Sequentially, heat treatment is performed for about three hours at a temperature of 1000° C. in a nitrogen atmosphere so as to diffuse respectively the N impurities in the lightly doped N region 13 and the P impurities in the lightly doped P region 15 which are implanted in the aforesaid step.

Figure 6:
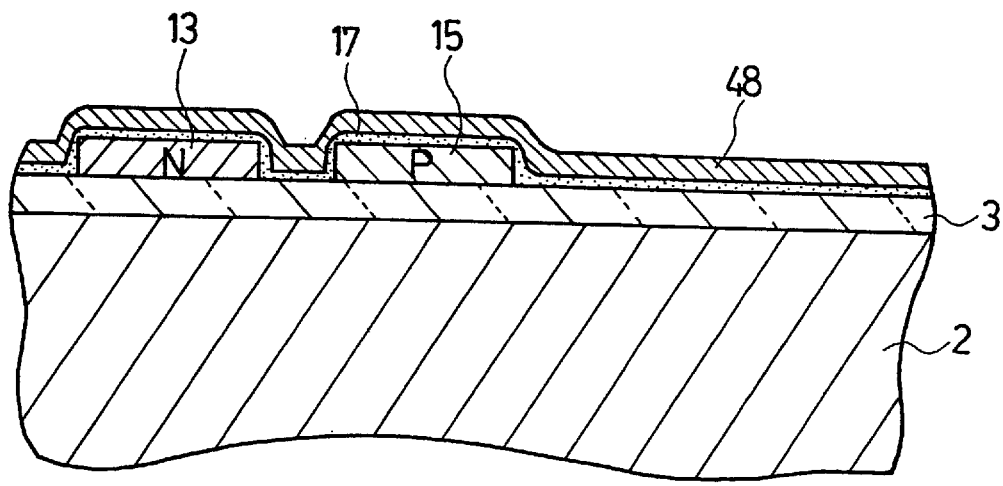

Next, oxidation treatment is performed for about thirty minutes at a temperature of about 1000° C. in a mixed atmosphere of oxygen and nitrogen in which pressure of oxygen is reduced by mixing nitrogen into oxygen so as to form the gate oxidation film 17 to be about 20 nm in oxidation film thickness over the entire top face of the buried oxidation film 3 including the lightly doped N region 13 and the lightly doped P region 15 as shown in FIG. 6. Moreover, a gate electrode layer 48 made of polycrystalline silicon is formed to be about 350 nm in film thickness in such a manner to cover the entire top face of the gate oxidation film 17 using the CVD (chemical-vapor deposition) using monosilane ($SiH_4$) and ammonia ($NH_3$) as reactive gas.

Figure 7:
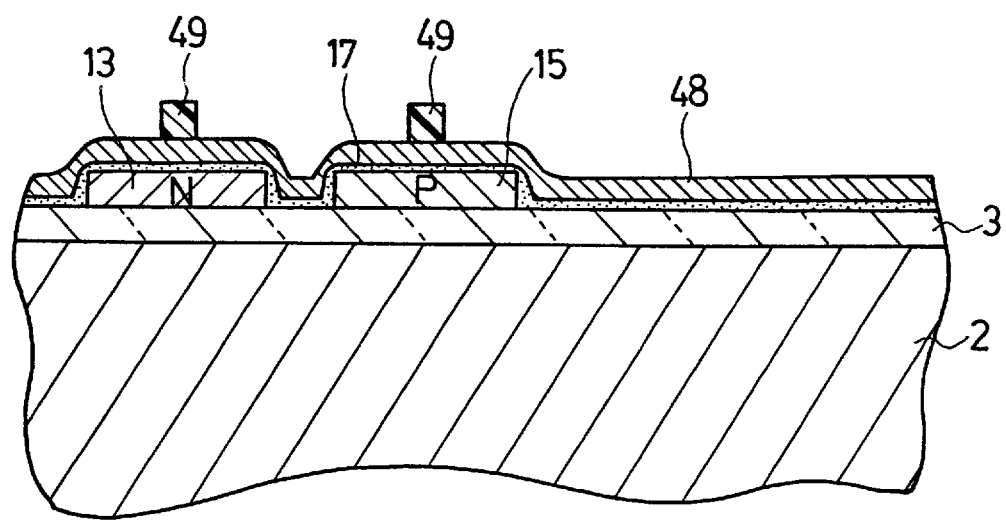

Sequentially, a photoresist is applied on the entire top face of the gate electrode layer 48 by the spin coating and exposed and developed using a predetermined photomask to be patterned so as to leave a photoresist 49 only at the component regions, as shown in FIG. 7, where gate electrodes are formed on the lightly doped N region 13 and the lightly doped P region 15.

Consecutively, the gate electrode layer 48 and the gate oxidation film 17 are etched in such a manner that a portion thereof which is not covered with the photoresist 49 is completely removed by the reactive ion etching using sulfur hexafluoride ($SF_6$) and oxygen ($O_2$) as reactive gas.

Figure 8:
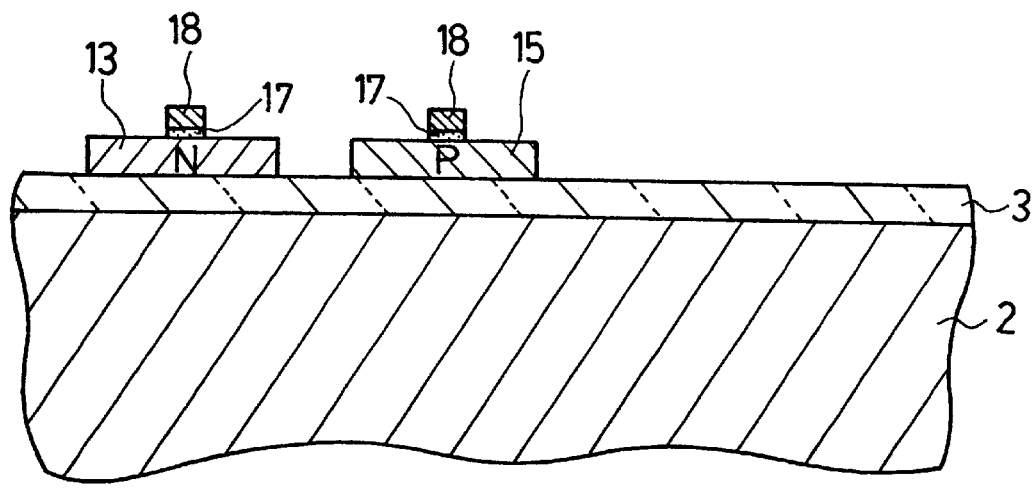

By the above etching, the gate electrodes 18 are formed above the respective center of the lightly doped N region 13 and the lightly doped P region 15 respectively with the gate oxidation films 17 therebetween as shown in FIG. 8. Thereafter, the photoresist 49 on the gate electrodes 18 is removed using sulfuric acid.

Figure 9:
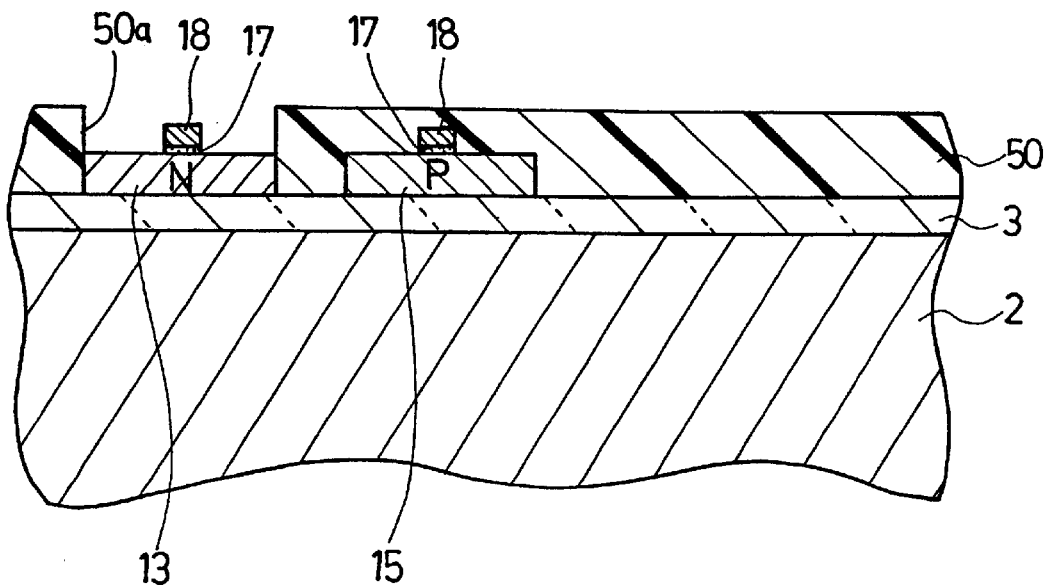

Then, a photoresist is again applied on the entire top face of the buried oxidation film 3 by the spin coating and a photoresist 50 is patterned to form an opening 50a at a position corresponding to the lightly doped N region 13 as shown in FIG. 9.

Figure 10:
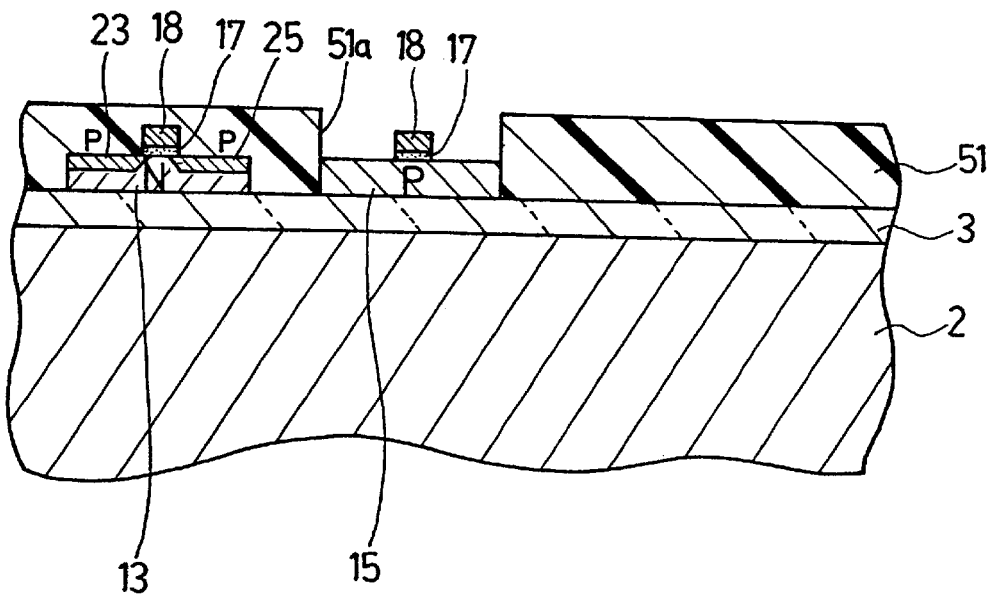

Sequentially, using the photoresist 50 as an ion implantation barrier film, P impurities (not shown) of which the conduction type is opposite to that of the lightly doped N region 13 are selectively ion-implanted into both sides of the gate electrode 18 of the lightly doped N region 13 under conditions in the order of 25 keV in implantation energy and $3 \times 10^{15}$ cm$^{-2}$ in implantation dose, thereby making the P drain layer 23 and the P source layer 25 shown in FIG. 10. Boron atoms are used as the P impurities. Thereafter, the photoresist 50 is removed using sulfuric acid.

Then, a photoresist is again applied on the entire top face of the buried oxidation film 3 by the spin coating and a photoresist 51 is patterned to form an opening 51a at a position corresponding to the lightly doped P region 15 as shown in FIG. 10.

Figure 11:
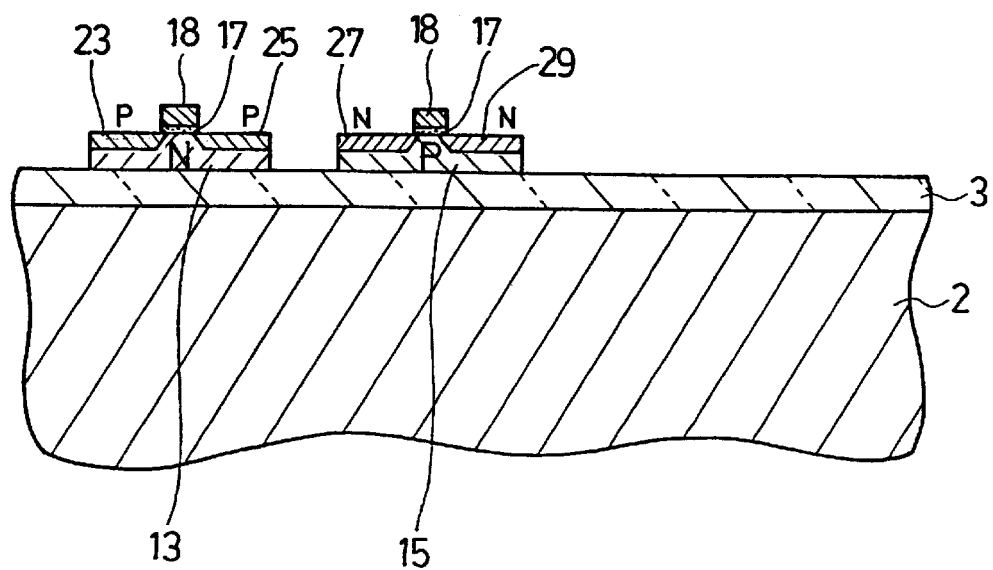

Sequentially, using the photoresist 51 as an ion implantation barrier film, N impurities (not shown) of which the conduction type is opposite to that of the lightly doped P region 15 are selectively ion-implanted into both sides of the gate electrode 18 of the lightly doped P region 15 under conditions in the order of 50 keV in implantation energy and $3 \times 10^{15}$ cm$^{-2}$ in implantation dose, thereby making the N drain layer 27 the N source layer 29 shown in FIG. 11.

Phosphorus atoms are used as the N impurities. Thereafter, the photoresist 51 is removed using sulfuric acid.

Hereinafter, specific process steps of the method of fabricating the semiconductor device according to the present invention will be described.

First, a photoresist is applied on the entire top face of the buried oxidation film including the component regions shown in FIG. 11 by the spin coating and a photoresist 55 is patterned to form an opening 55a at a position away from the lightly doped N region 13 and the lightly doped P region 15 as shown in FIG. 12.

Thereafter, the buried oxidation film 3 within the opening 55a of the photoresist 55 is selectively etched to be completely removed by the reactive ion etching using carbon tetrafluoride ($CF_4$), methane trifluoride ($CHF_3$), and helium (He) as reactive gas with the photoresist 55 as an etching mask so as to a form substrate contact hole 5 in the buried oxidation film 3 for exposing the support substrate 2 as shown in FIG. 13.

Then, the impurities of the same conduction type as the support substrate 2 are selectively ion-implanted into a portion of the support substrate 2 exposed within the substrate contact hole 5 using the photoresist 55 as an ion implantation barrier film. When the N impurities are implanted, phosphorus atoms are ion-implanted under conditions in the order of 50 keV in implantation energy and $3 \times 10^{15}$ cm$^{-2}$ in implantation dose. When the P impurities are implanted, boron atoms are ion-implanted under conditions in the order of 25 keV in implantation energy and $3 \times 10$ cm$^{-2}$ in implantation dose.

Thereafter, the photoresist 55 is removed with sulfuric acid, resulting in a state in which the heavily doped diffusion layer 7 is formed in the vicinity of the surface of the support substrate 2 within the substrate contact hole 5 as shown in FIG. 13.

Figure 14:
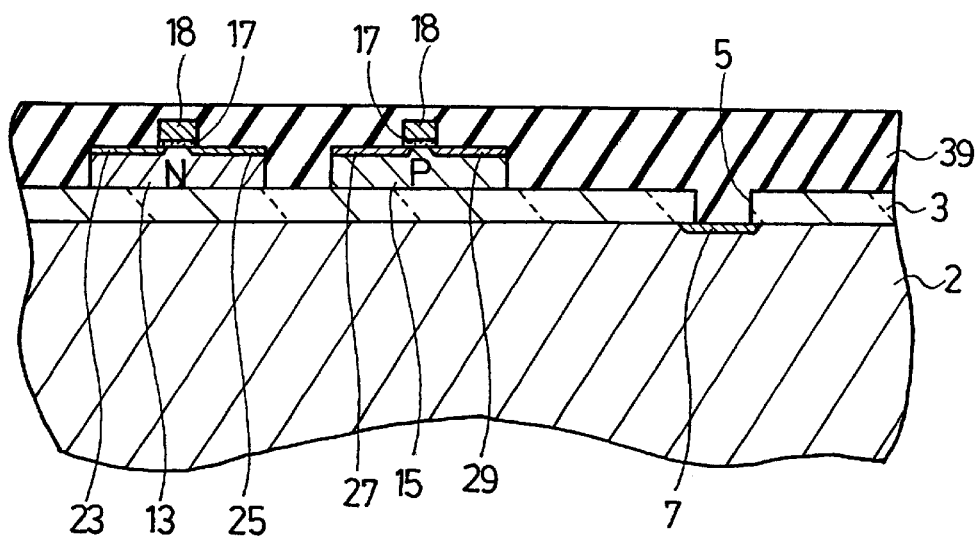

Next, the insulating film 39 made of silicon oxide including phosphorus and boron as impurities is formed to have a film thickness of about 0.5 $\mu$m to cover the entire top face of the support substrate 2 as shown in FIG. 14 by the CVD using monosilane ($SiH_4$), phosphine ($PH_3$), and diborane ($B_2H_6$) as reactive gas.

Thereafter, heat treatment is performed for about thirty minutes at a temperature of 900° C. in a nitrogen atmosphere. That electrically activates the P-type or N-type impurities respectively ion-implanted into the P drain layer 23 and the P source layer 25 on the lightly doped N region 13, the N drain layer 27 and the N source layer 29 on the lightly doped P region 15, and the heavily doped diffusion layer 7 formed in the vicinity of the support substrate 2. It should be noted that the heat treatment in a nitrogen atmosphere also flattens the surface of the insulating film 39.

Figure 15:
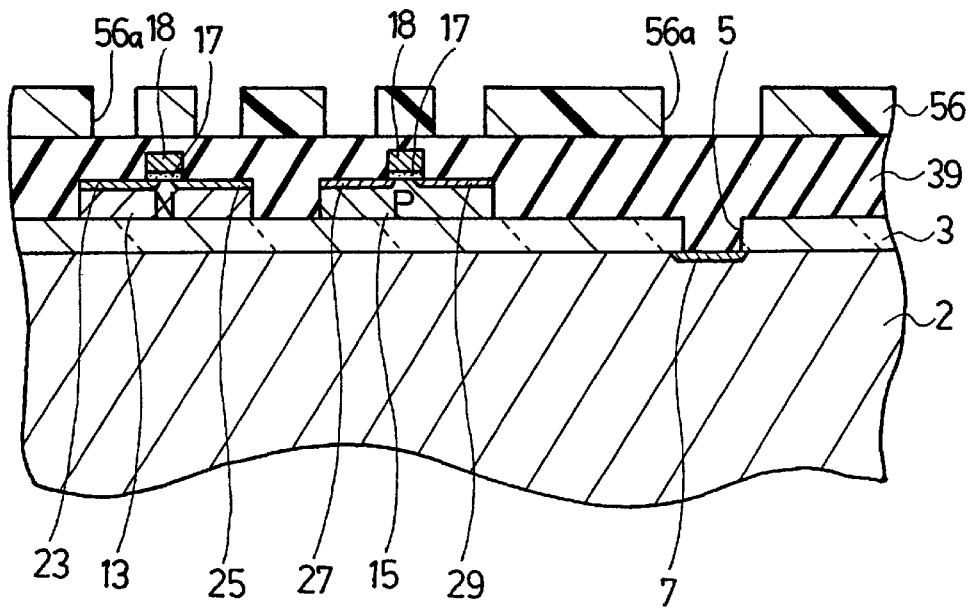

Next, a photoresist is applied on the entire top face of the insulating film 39 by the spin coating and exposed and developed using a predetermined photomask. Thereby, a photoresist 56 is patterned in such a manner to form openings 56a respectively at positions separately corresponding to each gate electrode 18 in each component region, the drain layers 23 and 27, the source layers 25 and 29, and the substrate contact hole 5 as shown in FIG. 15 (but the openings at the positions corresponding to the gate electrodes 18 are formed in a section different from FIG. 15).

Sequentially, the insulating film 39 exposed within each opening 56a of the photoresist 56 is etched to be completely removed by the reactive ion etching using carbon tetrafluoride ($CF_4$), methane trifluoride ($CHF_3$), and helium (He) as reactive gas. Thereafter, the photoresist 56 is removed with sulfuric acid.

Figure 16:
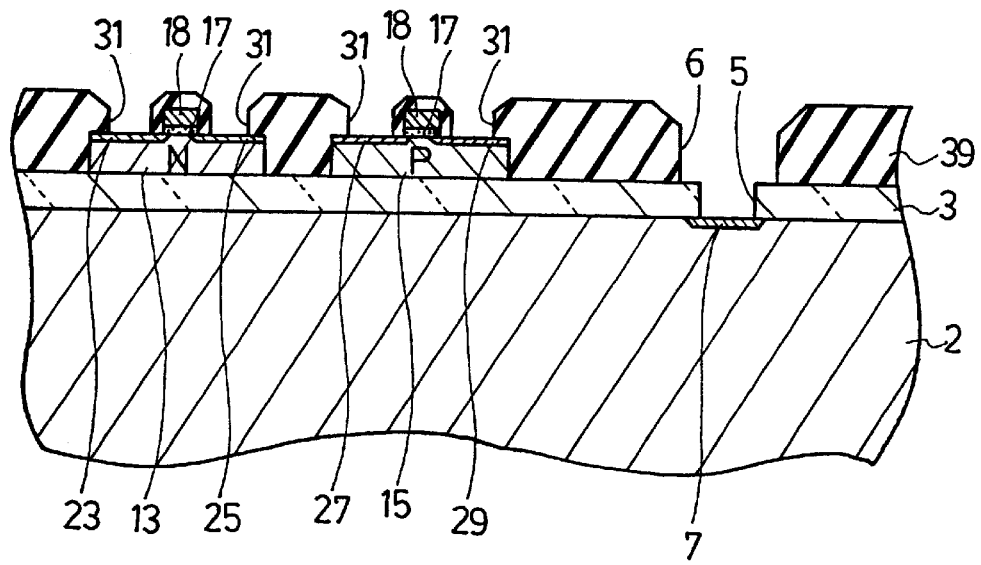

Thereby, the component contact holes 31 are formed respectively at positions of the insulating film 39 separately corresponding to each gate electrode 18 in each component region, the drain layers 23 and 27, and the source layers 25 and 29 as shown in FIG. 16 (but the component contact holes corresponding to the gate electrodes 18 are formed in a section different from FIG. 16) and the contact hole 6 is also formed at the position corresponding to the substrate contact hole 5.

Figure 17:
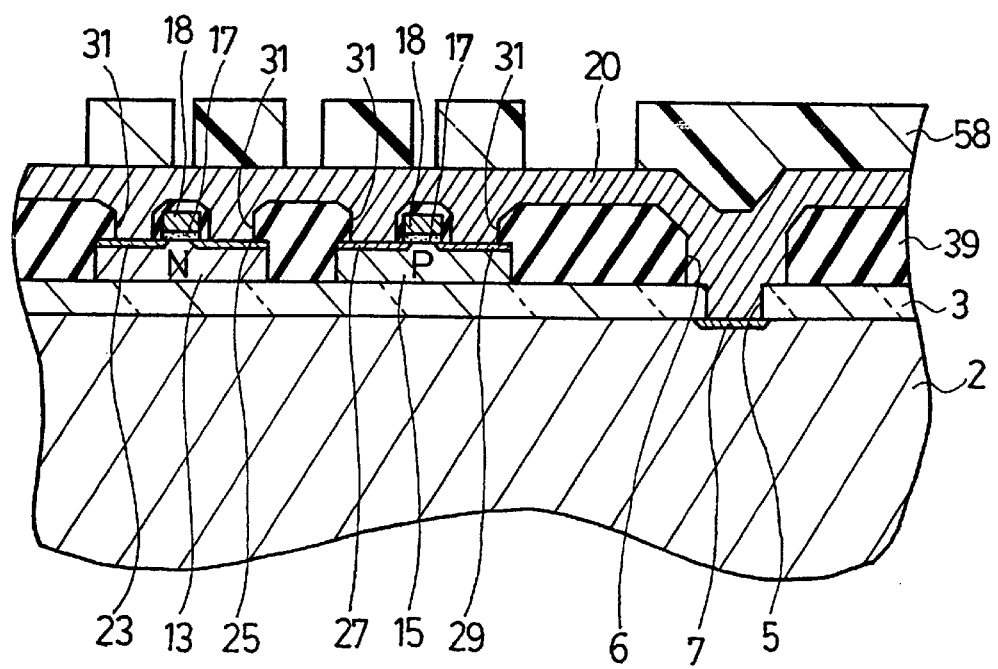

Consecutively, a step of forming a metal electrode is performed. First, as shown in FIG. 17, a metal electrode layer 20 is formed on the entire top face of the insulating film 39 and in all of the contact holes 31, 5 and 6 by the spattering to be about 1 μm in film thickness on the insulating film 39. Aluminum is used as the material of the metal electrode 20.

Thereafter, a photoresist is applied on the entire top face of the metal electrode layer 20 by the spin coating and patterned so as to leave a photoresist 58 only at the regions where respective metal electrodes are formed as shown in FIG. 17.

Sequentially, the metal electrode layer 20 is etched by the reactive ion etching using boron trichloride ($BCl_3$) and chlorine ($Cl_2$) as reactive gas with the photoresist 58 as an etching mask in such a manner that a portion of the metal electrode layer 20 which is not covered with the photoresist 58 is completely removed. Thereafter, the photoresist 58 is removed using nitric acid ($HNO_3$).

Figure 18:
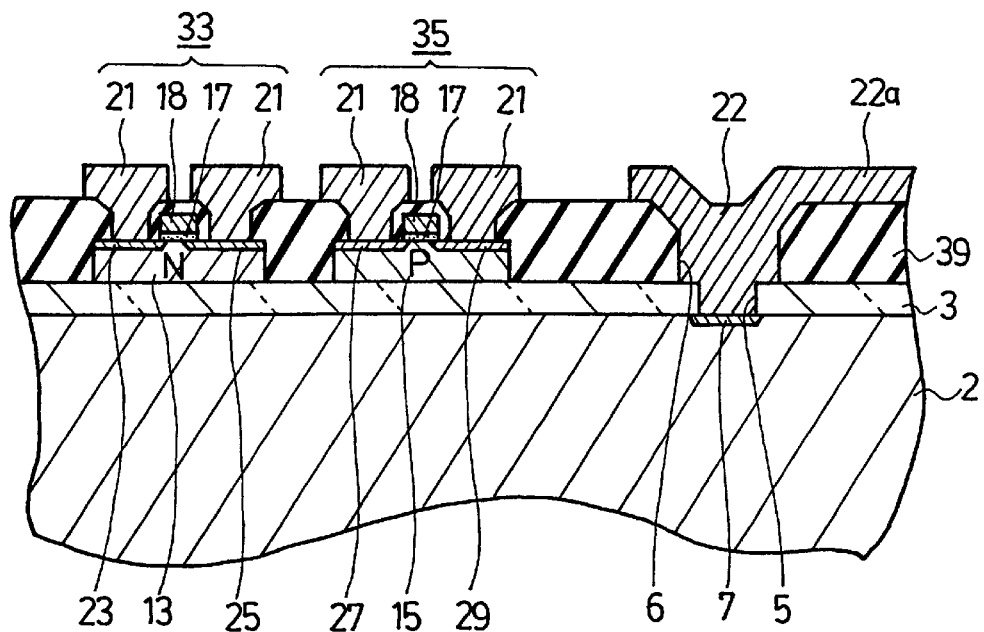

Thereby, as shown in FIG. 18, the metal electrodes (interconnection electrodes) 21 separately connecting with the gate electrode 18, the P drain layer 23, and the P source layer 25 of the lightly doped N region 13 through the respective component contact holes 31 are formed (but the metal electrodes connecting with the gate electrodes 18 are formed at the positions in a section different from FIG. 18) to complete the P channel FET 33.

The metal electrodes (interconnection electrodes) 21 separately connecting with the gate electrode 18, the N drain layer 27, and the N source layer 29 of the lightly doped P region 15 through the respective component contact holes 31 are formed (but the metal electrodes connecting with the gate electrodes 18 are formed at the positions in a section different from FIG. 18) to complete the N channel FET 35.

Further, the metal electrode 22 connected with the heavily doped diffusion layer 7 of the support substrate 2 through the contact hole 6 in the insulating film 39 and the substrate contact hole 5 in the buried oxidation film 3 is formed and the metal electrode 22 is provided with the pad portion 22*a* extending onto the insulating film 39.

It should be noted that the P channel FET 33 and the N channel FET 35 constitute a CMOS transistor, and some metal electrodes 21 connect with each other on the insulating film 39 and the other metal electrodes 21 are provided with the pad portions for connecting with the outside.

Figure 19:
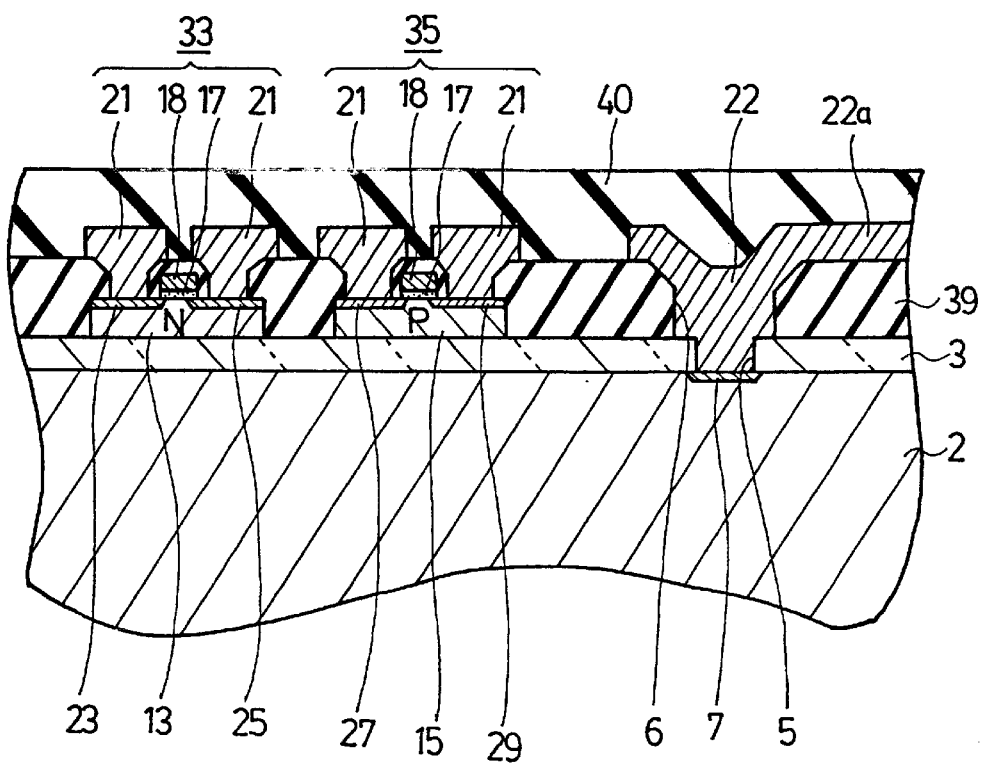

Next, the passivation film 40 made of nitride film is formed to have a film thickness of about 0.8 μm to cover the entire top face of the insulating film 39 including each metal electrode 21 and 22 as shown in FIG. 19 by the CVD using monosilane ($SiH_4$) and ammonia ($NH_3$) as reactive gas.

Figure 20:
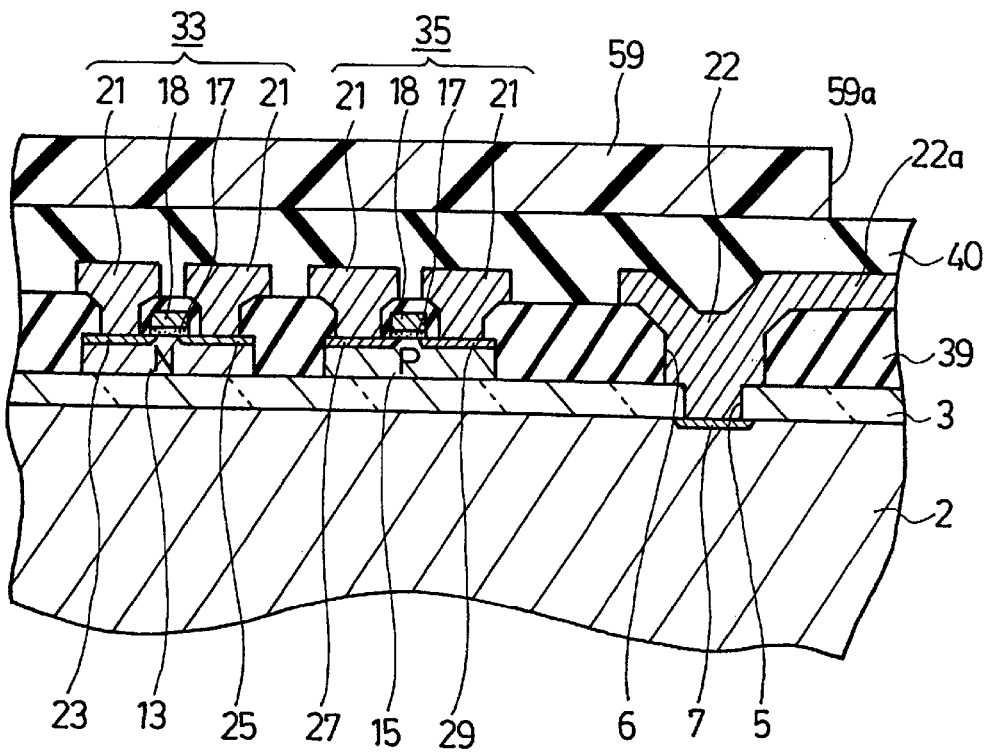

Further, a photoresist is applied on the entire top face of the passivation film 40 by the spin coating and exposed and developed using a predetermined mask to pattern a photoresist 59 in such a manner to form an opening 59*a* at a position above the pad portion 22*a* of the metal electrode 22 as shown in FIG. 20.

Then, the passivation film 40 is etched by the reactive ion etching using carbon tetrafluoride and oxygen as reactive gas with the photoresist 59 as an etching mask in such a manner that a portion of the passivation film 40 which is exposed within the opening 59*a* of the photoresist 59 is completely removed. Thereafter, the photoresist 59 is removed using nitric acid.

Figure 21:
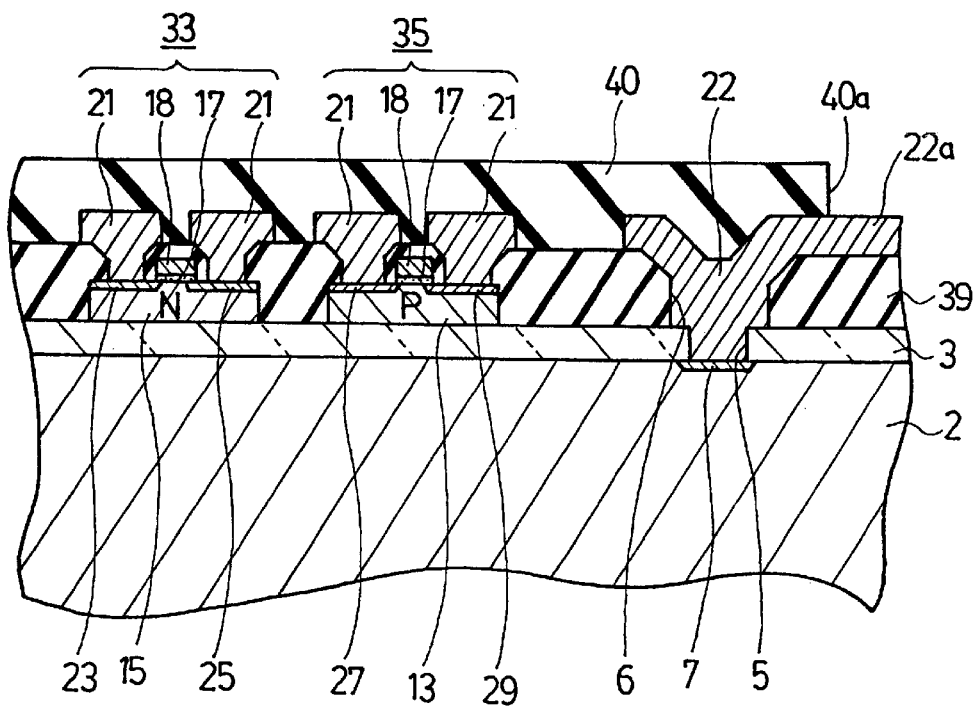

Thereby, the opening 40*a* is formed in the passivation film 40 and the pad portion 22*a* of the metal electrode 22 is exposed as shown in FIG. 21.

The pad portion 22*a* is subjected to gold plating to form the connection electrode 42 shown in FIG. 1, thereby completing the semiconductor device (IC chip) 10. Such connecting electrodes are formed, not shown, also at the pad portions of the metal electrodes 21 connecting with the outside out of those of the semiconductor components.

According to the aforesaid fabricating method, the P channel FET 33 and the N channel FET 35 are formed on the SOI substrate as the semiconductor components, the metal electrode 22 electrically contacting the face on the front side of the support substrate 2 through the heavily doped diffusion layer 7 is formed, and the connecting electrode provided on the pad portion can be formed in such a manner to be exposed in the top face of the semiconductor device.

Therefore, regardless of the mounting method of the semiconductor device 10, the support substrate 2 can be grounded or set at any bias.

Figure 22:
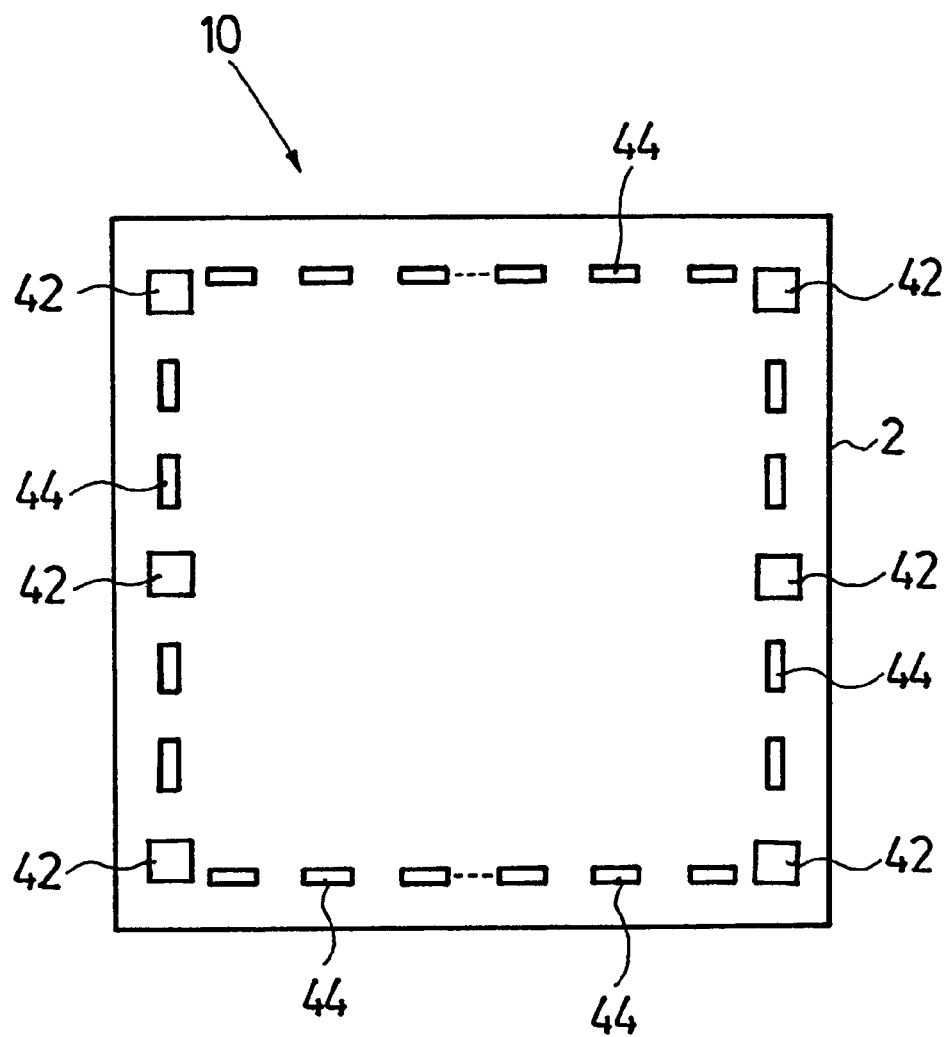
FIG. 22 is a plane view showing an example of arrangement of connecting electrodes in the semiconductor device according to the present invention.

It should be noted that the plane shape of the semiconductor device 10 is the same as that of the support substrate 2, and if the shape thereof forms into a square or a rectangle as shown in FIG. 22, the connecting electrodes 42 electrically connected with the support substrate 2 and connecting electrodes 45 provided at some of the metal electrodes 21 of the semiconductor components can be arranged at required positions along the periphery of the support substrate 2 on the semiconductor device 10.

Through the use of a plurality of the connecting electrodes 42, the support substrate 2 can be grounded or set at any bias at desired position.

However, the arrangement of the connecting electrodes 42 is not only limited to the peripheral portion of the support substrate 2 but also at any positions. For instance, the connecting electrodes 42 may be arranged at the position corresponding to the central portion of the support substrate 2.

Figure 23:
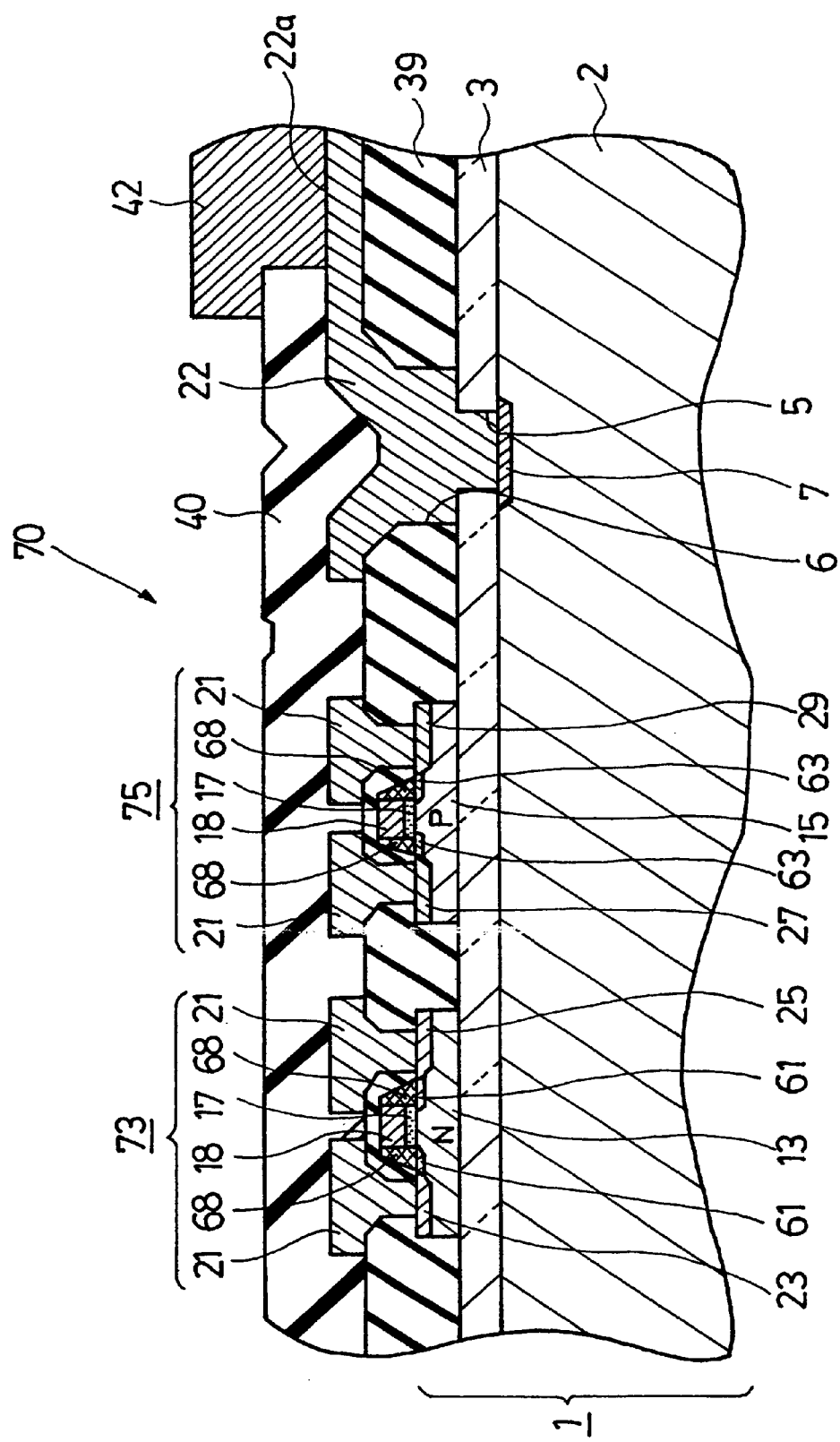
FIG. 23 is a schematic sectional view showing the enlarged principal portion of a second embodiment of a semiconductor device according to the present invention.

Second Embodiment of the Semiconductor Device: FIG. 23

The semiconductor device in which the field effect transistors (MOSFETs) of single drain structure are formed on the SOI substrate as the semiconductor components has been described in the aforesaid first embodiment. Next, the semiconductor device in which MOSFETs of LDD (Lightly Doped Drain) structure are formed on the SOI substrate will be described as the second embodiment of the semiconductor device according to the present invention.

FIG. 23 is a schematic sectional view, similar to FIG. 1, showing the enlarged principal portion of the semiconductor device, and the same numerals are given to the portions corresponding to those in FIG. 1.

A semiconductor device 70 differs from the semiconductor device 10 of the first embodiment shown in FIG. 1 in that MOSFETs of LDD structure are formed as the semiconductor components, and the other structure is common to them. Therefore, in the description hereinafter, the MOSFETs are mainly explained and the description of the other portions will be omitted or simplified.

In the semiconductor device 70 shown in FIG. 23, a P channel FET 73 and an N channel FET 75 each of which has the LDD structure are formed on a buried oxidation film 3 of an SOI substrate 1 as the semiconductor components.

The P channel FET 73 is formed on a lightly doped N region 13 within a component region and differs from the P channel FET 33 in the semiconductor device 10 of the first embodiment in the following point. That is the point that the P channel FET 73 has side walls 68 and 68 on both sides of a gate electrode 18, and P-type lightly doped drain layers 61 and 61 are provided on the lightly doped N region 13 under the respective side walls 68 and 68. Accordingly, the P-type lightly doped drain layers 61 are formed between the gate electrode 18 and a P drain layer 23 and between the gate electrode 18 and a P source layer 25 respectively.

The N channel FET 75 is formed on a lightly doped P region 15 within a component region and differs from the N channel FET 35 in the semiconductor device 10 of the first embodiment in the following point. That is the point that the N channel FET 75 has the side walls 68 and 68 on both sides of the gate electrode 18, and N-type lightly doped drain layers 63 and 63 are provided on the lightly doped P region 15 under the respective side walls 68 and 68. Accordingly, the N-type lightly doped drain layers 63 are formed between the gate electrode 18 and an N drain layer 27 and between the gate electrode 18 and an N source layer 29 respectively.

Also in the semiconductor device 70 of the second embodiment, a metal electrode 22 connecting with the support substrate 2 through a heavily doped diffusion layer 7 is provided throughout a substrate contact hole 5 formed in the buried oxidation film 3 and a contact hole 6 formed in an insulating film 39, a pad portion 22a is extended from a metal electrode 22 onto the insulating film, and a connecting electrode 42 with gold plating is provided on the pad portion 22a, similarly to the semiconductor device 10 of the first embodiment.

Accordingly, the same effects as in the semiconductor device 10 of the first embodiment can be obtained also in the semiconductor device 70. Moreover, in the P channel FET 73 and the N channel FET 75, the lightly doped drain layers 61 or 63 are provided between the gate electrode 18 and the drain layer 23 or 27, and between the gate electrode 18 and the source layer 25 or 29 respectively, so that leak current between the channels can be reduced to enhance withstand voltage.

Additionally, the lightly doped drain layers 61 and 63 are formed self-aligned with the side walls 68 provided on both sides of the gate electrodes 18, thus they can be formed in a minute semiconductor component and applied to a high-density IC chip.

Second Embodiment of the Method of Fabricating the Semiconductor Device: FIG. 24 through FIG. 27 and so on Next, the method of fabricating the aforesaid semiconductor device 70 shown in FIG. 23 will be described as the second embodiment of the method of fabricating the semiconductor device according to the present invention with reference to FIG. 24 through FIG. 27 and so on.

The second embodiment of the method of fabricating the semiconductor device differs from the first embodiment which has been described with FIG. 2 through FIG. 21 in a part of the steps of forming the semiconductor components, that is, the steps of forming the P channel FET 73 and the N channel FET 75, therefore the different steps will be mainly described.

Each step from FIG. 2 to FIG. 8 in the first embodiment is the same as in the second embodiment.

Accordingly, the surface silicon layer 4 provided on the buried oxidation film 3 of the SOI substrate 1 is etched to form the island-shape surface silicon layers 4a and 4b within the component regions, and the surface silicon layers 4a and 4b are subjected to heat treatment after N-type or P-type impurities are selectively ion-implanted thereto to form the lightly doped N region 13 and the lightly doped P region 15 respectively. Then, the gate electrodes 18 are formed respectively above the center of the lightly doped N region 13 and the lightly doped P region 15 with the oxidation films 17 therebetween, resulting in a state shown in FIG. 8.

Thereafter, as shown in FIG. 9, the photoresist 50 formed on the entire top face of the buried oxidation film 3 is patterned so as to form the opening 50a only above the lightly doped N region 13. Then, using the photoresist 50 as an ion implantation barrier film, P impurities of which the conduction type is opposite to that of the lightly doped N region 13 are selectively ion-implanted into both sides of the gate electrode 18 of the lightly doped N region 13 under conditions in the order of 25 keV in implantation energy and $1 \times 10^{13}$ cm$^{-2}$ in implantation dose, thereby making the lightly doped drain layers 61 and 61 shown in FIG. 24. Boron atoms are used as the P impurities. Thereafter, the photoresist 50 is removed using sulfuric acid.

Figure 24:
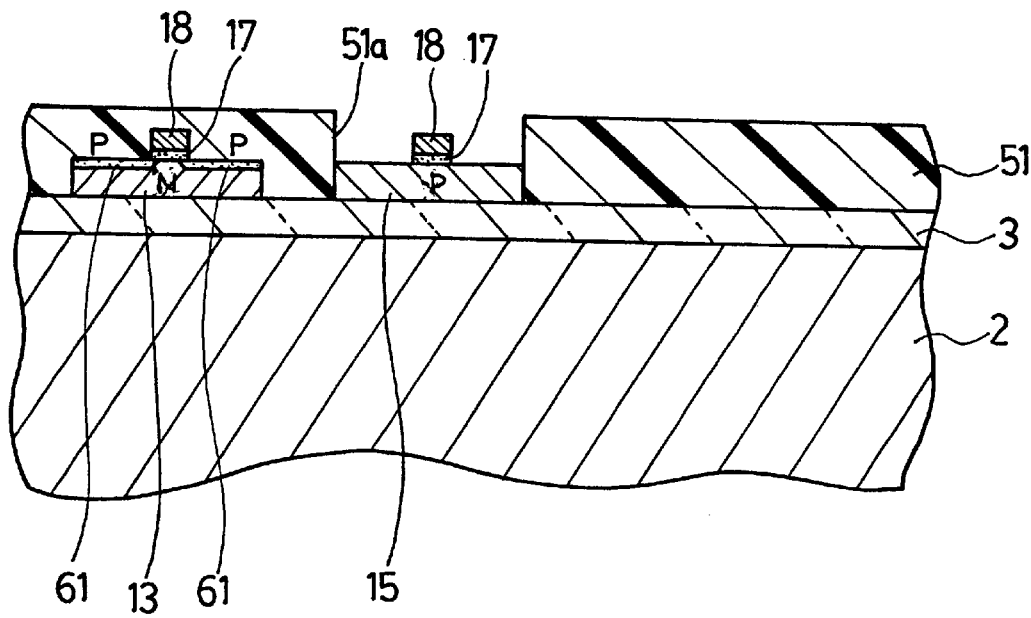
FIG. 24 through FIG. 27 are schematic sections views, similar to FIG. 23, showing middle steps for explaining a second embodiment of a fabricating method of the semiconductor device according to the present invention.

Next, the photoresist 51 shown in FIG. 24 is applied on the entire top face of the buried oxidation film 3 by the spin coating and exposed and developed using a predetermined mask to be patterned in such a manner to form the opening 51a only above the lightly doped P region 15.

Figure 25:
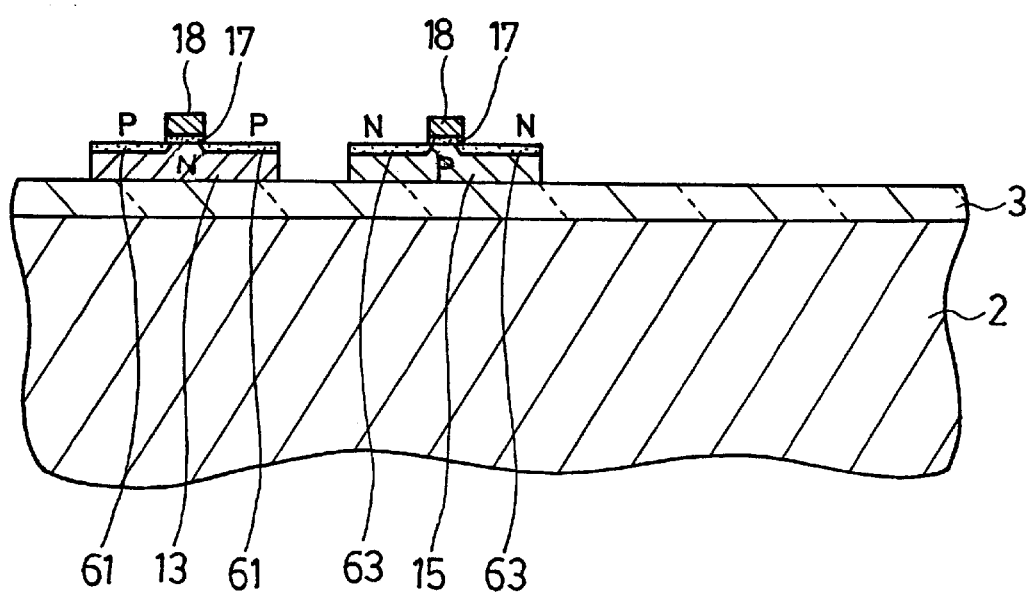

Sequentially, using the photoresist 51 as an ion implantation barrier film, N impurities of which the conduction type is opposite to that of the lightly doped P region 15 are selectively ion-implanted into both sides of the gate electrode 18 of the lightly doped P region 15 under conditions in the order of 25 keV in implantation energy and $1 \times 10^{13}$ cm$^{-2}$ in implantation dose, thereby making the lightly doped drain layers 63 and 63 shown in FIG. 25. Phosphorus atoms are used as the N impurities. Thereafter, the photoresist 51 is removed using sulfuric acid resulting in a state shown in FIG. 25.

Figure 26:
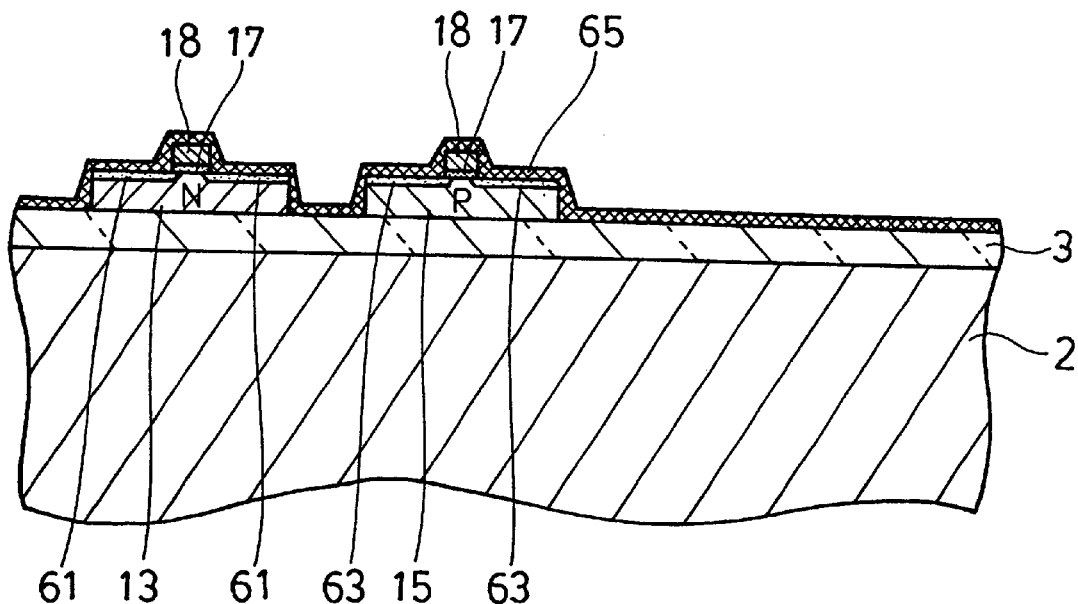

Thereafter, a silicon oxidation film 65 is formed to be about 0.3 µm in film thickness on the entire top face of the buried oxidation film 3 including component regions as shown in FIG. 26 by the CVD using monosilane and oxygen as reactive gas.

Sequentially, a photoresist (not shown) is applied on the entire top face of the silicon oxidation film 65 and patterned in such a manner to remain only at positions corresponding to the side walls of the gate electrode 18 in each component region.

The silicon oxidation film 65 is etched by the reactive ion etching using methane trifluoride and carbon tetrafluoride as reactive gas with the above photoresist (not shown) as an etching mask in such a manner to remain only at the side wall portions of each gate electrode 18. Thereby, the side walls 68 and 68 (refer to FIG. 27) made of silicon oxidation film are formed at both sides walls of each gate electrode 18.

Moreover, oxidation treatment is performed for about thirty minutes at a temperature of about 900° C. in a mixed atmosphere of oxygen and nitrogen in which pressure of oxygen is reduced by mixing nitrogen into oxygen so as to form a coating film made of oxidized silicon (not shown) to be about 20 nm in film thickness on the entire top face. This coating film made of oxidized silicon becomes a buffer film for implanting desired ions on the occasion of ion-implantation described later.

Thereafter, P impurities are selectively ion-implanted into both sides of the gate electrode 18 of the lightly doped N region 13 and N impurities are selectively ion-implanted into both sides of the gate electrode 18 of the lightly doped P region 15 in the same steps as those of the first embodiment which have been described with FIG. 9 to FIG. 11.

Figure 27:
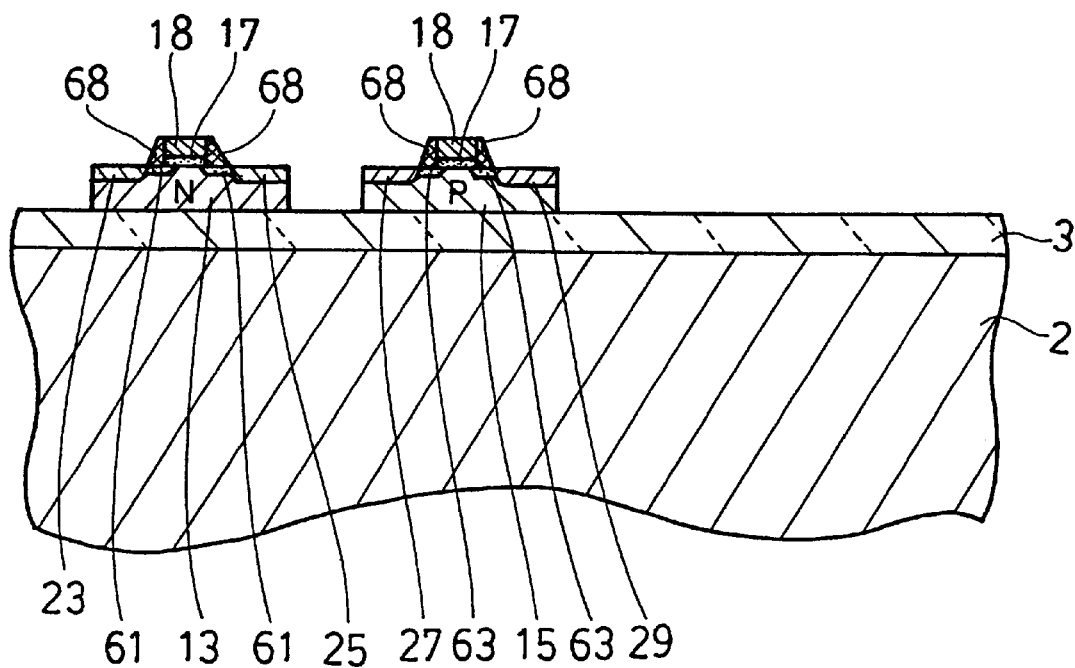

Consequently, as shown in FIG. 27, the drain layer 23 and source 25 of P-type, and the drain layer 27 and source layer 29 of N-type are formed within the lightly doped N region 13 and the lightly doped P region 15 respectively.

However, since impurities are not ion-implanted right under the side walls 68 and 68 on both sides of the respective gate electrodes 18, the regions which are self-aligned with the side walls 68 and 68 remain as the lightly doped drain layer 61 of P-type and the light doped drain layer 63 of N-type.

Thereafter, the substrate contact hole 5, the heavily doped diffusion layer 7, the insulating film 39, the contact holes 31 and 6, the metal electrodes 21 and 22, the passivation film 40, and the connecting electrode 42 are formed in order in the same step as those of the first embodiment which have been described with FIG. 12 to FIG. 21, thereby completing the semiconductor device 70 shown in FIG. 23.

Figure 28:
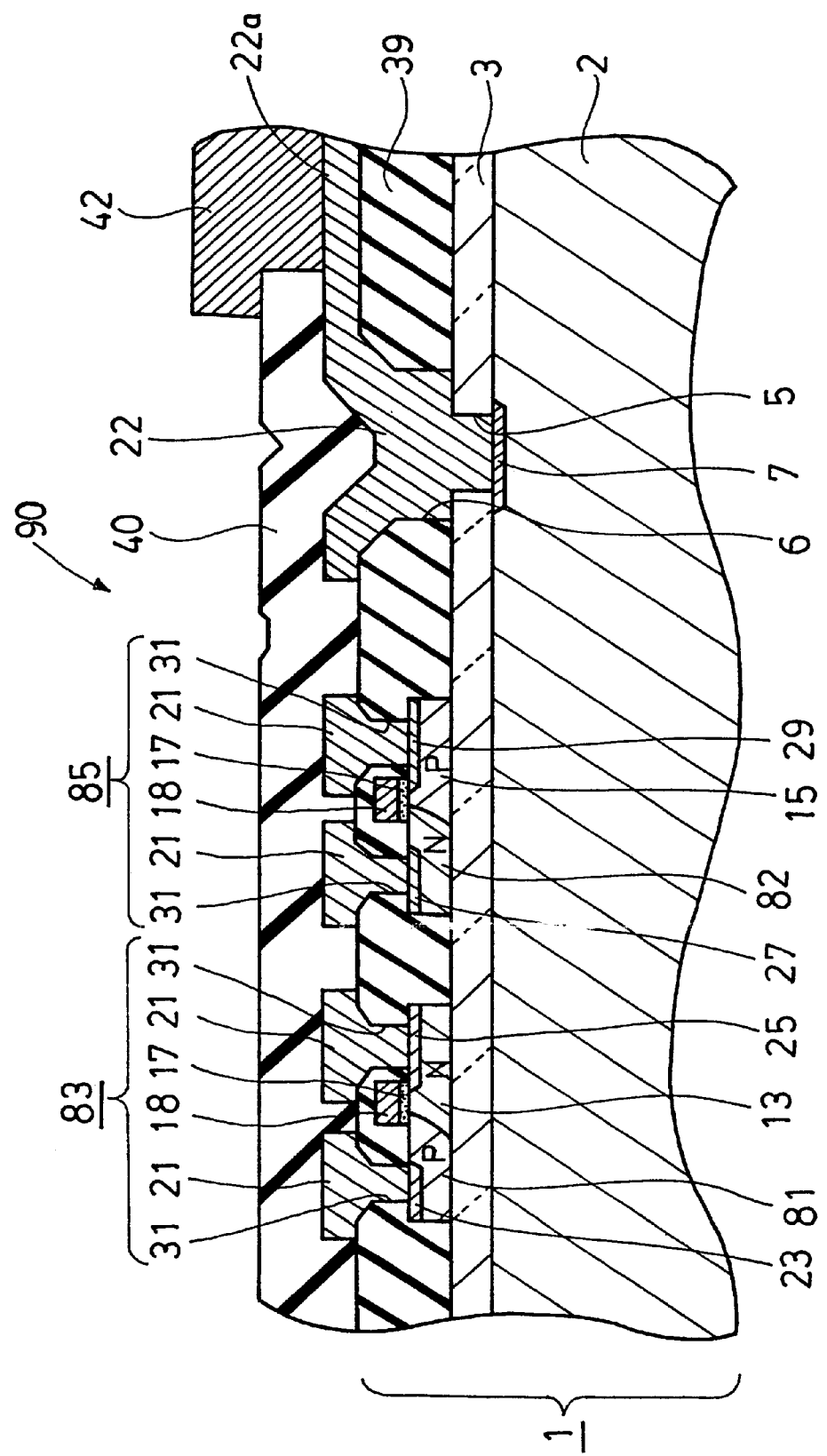
FIG. 28 is a schematic sectional view showing the enlarged principal portion of a third embodiment of a semiconductor device according to the present invention.
Figure 29:
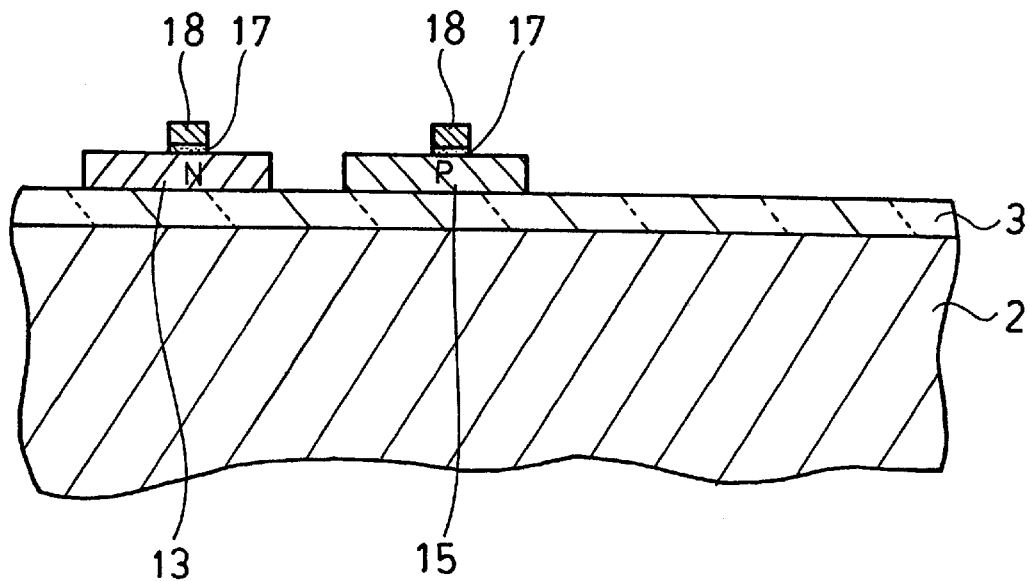
FIG. 29 through FIG. 35 are schematic sectional views, similar to FIG. 28, showing middle steps for explaining a third embodiment of a fabricating method of the semiconductor device according to the present invention.

Third Embodiment of the Semiconductor Device: FIG. 28

Next, the third embodiment of the semiconductor device according to the present invention will be described with FIG. 28. FIG. 28 is a schematic sectional view showing the enlarged principal portion of the semiconductor device.

A semiconductor device 90 shown in FIG. 28 differs from the semiconductor device 10 of the first embodiment shown in FIG. 1 and the semiconductor device 70 of the second embodiment shown in FIG. 23 only in that field effect transistors (MOSFETs) of offset drain structure are formed on the buried oxidation film of the SOI substrate as a plurality of semiconductor components.

Therefore, the same numerals are given to the portions in FIG. 28 corresponding to those in FIG. 1 and FIG. 23, and the description thereof will be omitted.

In the semiconductor device 90 of the third embodiment shown in FIG. 28, a P channel FET 83 and an N channel FET 85 each of which has an offset drain structure are formed on a buried oxidation film 3 of a SOI substrate 1. These can also reduce leak current between the channels to enhance withstand voltage, similarly to the P channel FET 73 and the N channel FET 75 of LDD structure in the semiconductor device 70 shown in FIG. 23. However, these can not be fabricated as minute as FETs of LDD structure, therefore these are suitable for an IC chip which is not so high in density.

The P channel FET 83 is formed on a lightly doped N region 13 within a component region and differs from the P channel FET 33 in the semiconductor device 10 shown in FIG. 1 in the following two points: that the formation positions of a gate oxidation film 17 and a gate electrode 18 on the lightly doped N region 13 are shifted toward a P source layer 25 side; and that a P offset region 81 is provided between the gate electrode 18 and a P drain layer 23.

The N channel FET 85 is formed on a lightly doped P region 15 within a component region and differs from the N channel FET 35 in the semiconductor device 10 shown in FIG. 1 in the following two points: that the formation positions of a gate oxidation film 17 and a gate electrode 18 on the lightly doped P region 15 are shifted toward an N source layer 29 side; and that an N offset region 82 is provided between the gate electrode 18 and an N drain layer 27.

Also in the semiconductor device 90, a metal electrode 22 and a connecting electrode 42 electrically connected with the support substrate 2 of the SOI substrate 1 are provided on the side of the component face, which is the same as in the aforesaid semiconductor devices 10 and 70, the support substrate 2 can be grounded or set at any bias regardless of the mounting method.

Modification of the Semiconductor Device

In the aforesaid first to third embodiments of the semiconductor device, examples in which three kinds of CMOS transistors are formed on the buried oxidation film of the SOI substrates as the semiconductor components have been described. However, the semiconductor device according to the present invention is not only limited to the above examples but also can be applied to semiconductor devices provided with various semiconductor components such as other kind of filed effect transistors (FETs), bipolar transistors and the like. The same operation effects as in the aforesaid embodiments can be obtained also in those cases.

Third Embodiment of the Method Fabricating the Semiconductor Device: FIG. 29 through FIG. 35 and so on.

Next, the method of fabricating the aforesaid semiconductor device 90 shown in FIG. 28 will be described as the third embodiment of the method of fabricating the semiconductor device according to the present invention with reference to FIG. 29 through FIG. 35 and so on.

The third embodiment of the method of fabricating the semiconductor device differs from the first embodiment which has been described with FIG. 2 through FIG. 21 in a part of the steps of forming the semiconductor components, that is, the steps of forming the P channel FET 83 and the N channel FET 85, therefore the different step will be mainly described.

Each step from FIG. 2 to FIG. 8 in the first embodiment is nearly the same as in the third embodiment.

Accordingly, the surface silicon layer 4 provided on the buried oxidation film 3 of the SOI substrate 1 is etched to form the island-shape surface silicon layer 4a and 4b within the component regions, and the surface silicon layers 4a and 4b are subjected to heat treatment after N-type or P-type impurities are selectively ion-implanted thereto to form the lightly doped N region 13 and the lightly doped P region 15 respectively. Then, the gate electrodes are formed respectively above the lightly doped N region 13 and the lightly doped P region 15 with the gate oxidation films therebetween.

However, in this embodiment, the gate electrodes 18 are formed not above the center of the lightly doped N region 13 and the lightly doped P region 15 but at positions somewhat shifted to the source layers (right in FIG. 29), which are formed in the later step respectively, with the gate oxidation films 17 therebetween.

Figure 30:
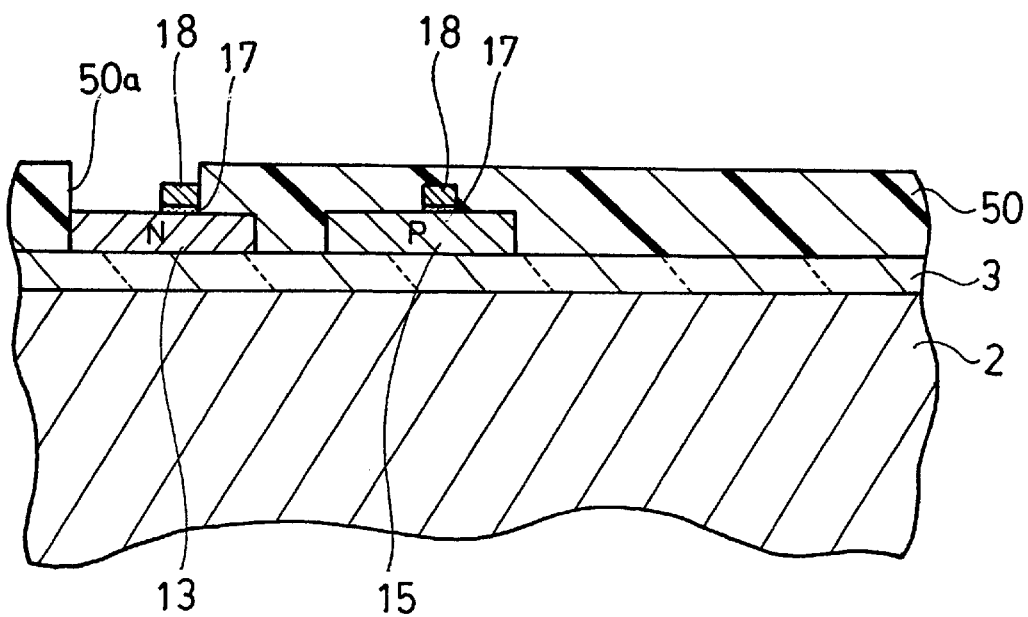

Next, a photoresist is applied on the entire top face of the buried oxidation film 3 including the component regions and the photoresist 50 is patterned to form the opening 50a within a region on one side (the side where the drain layer will be formed in the later step) of the gate electrode 18 on the lightly doped N region 13 as shown in FIG. 30.

Figure 31:
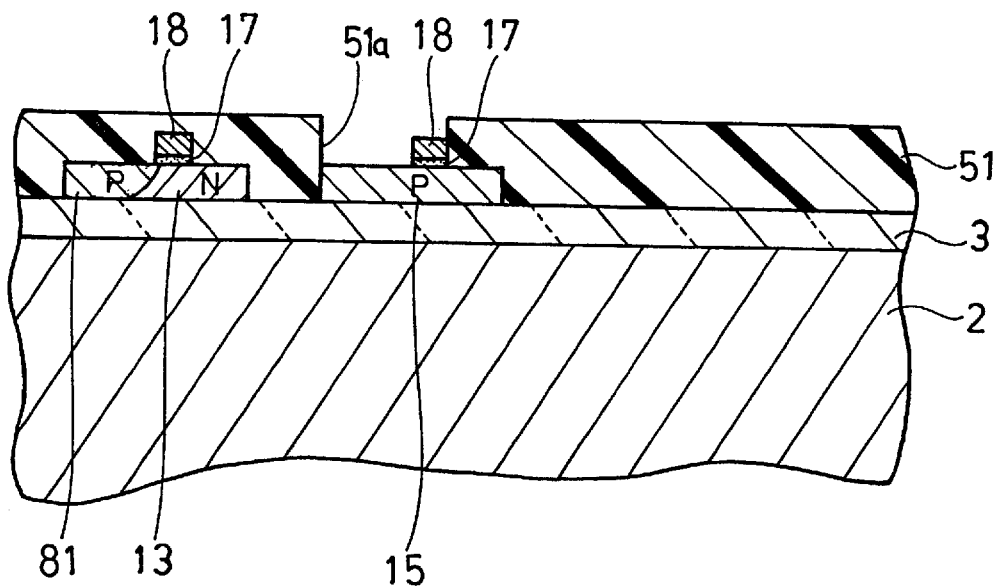

Then, using the photoresist 50 as an ion implantation barrier film, P impurities of which the conduction type is opposite to that of the lightly doped N region 13 are selectively ion-implanted into a region on one side of the lightly doped N region 13 under conditions in the order of 50 keV in implantation energy and $1\times10^{13}$ cm$^{-2}$ in implantation dose, thereby making the P offset region 81 shown in FIG. 31. Boron atoms are used as the P impurities. Thereafter, the photoresist 50 is removed using sulfuric acid.

Then, a photoresist is again applied on the entire top face of the buried oxidation film 3 including the component regions and the photoresist 51 is patterned to form the opening 51a within a region on one side (the side where the drain layer will be formed in the later step) of the gate electrode 18 on the lightly doped P region 15 as shown in FIG. 31.

Figure 32:
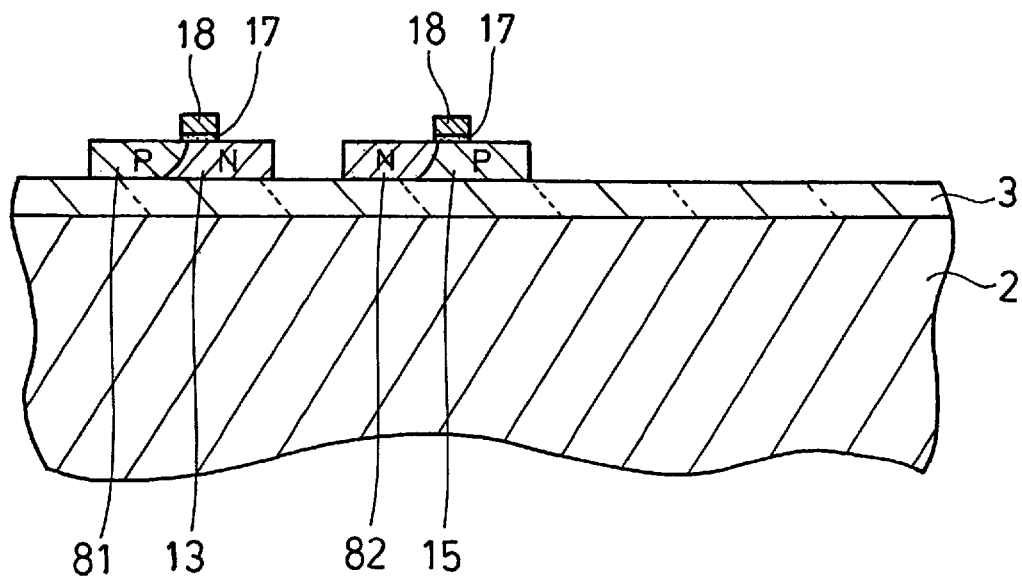

Sequentially, using the photoresist 51 as an ion implantation barrier film, N impurities of which the conduction type is opposite to that of the lightly doped P region 15 are selectively ion-implanted into a region on one side of the lightly doped P region 15 under conditions in the order of 50 keV in implantation energy and $1 \times 10^{13}$ cm$^{-2}$ in implantation dose, thereby making the N offset region 82 shown in FIG. 32. Phosphorus atoms are used as the N impurities. Thereafter, the photoresist 51 is removed using sulfuric acid.

Sequentially, heat treatment is performed for about four hours at a temperature of 1100° C. in a nitrogen atmosphere so as to diffuse the P impurities and the N impurities ion-implanted into the offset regions 81 and 82 shown in FIG. 32.

Moreover, oxidation treatment is performed for about thirty minutes at a temperature of about 900° C. in a mixed atmosphere of oxygen and nitrogen in which pressure of oxygen is reduced by mixing nitrogen into oxygen so as to form a coating film made of oxidized silicon (not shown) to be about 20 nm in film thickness on the entire top face. This coating film made of oxidized silicon becomes a buffer film for implanting desired ions on the occasion of ion-implantation described later.

Figure 33:
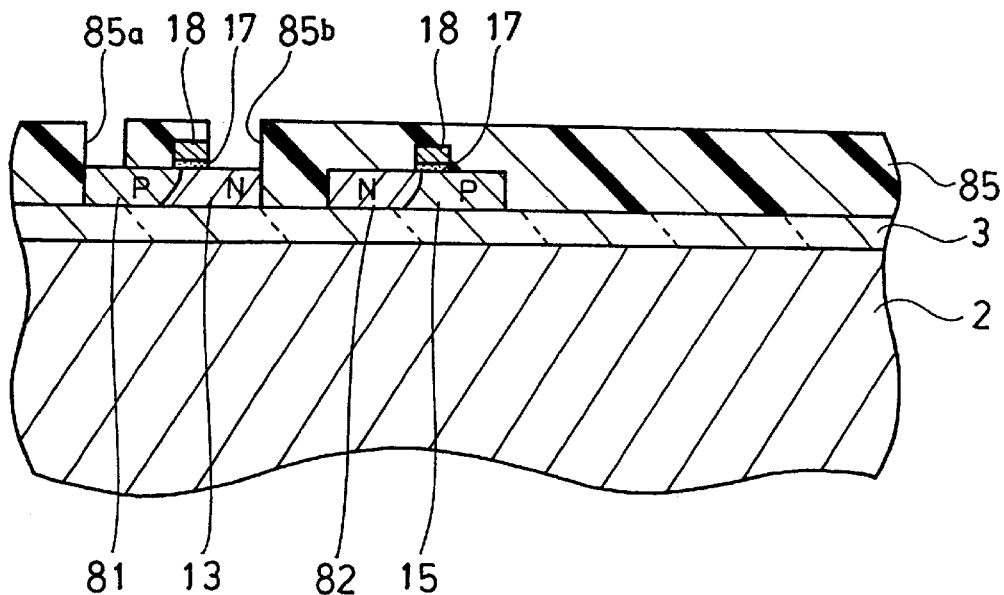

Next, a photoresist is applied on the entire top face of the buried oxidation film 3 including the component regions and a photoresist 84 is patterned to form an opening 84a and an opening 84b, as shown in FIG. 33, respectively within a region where the drain layer of the P channel FET is formed and a region where the source layer thereof is formed in the later steps of out of component regions.

Figure 34:
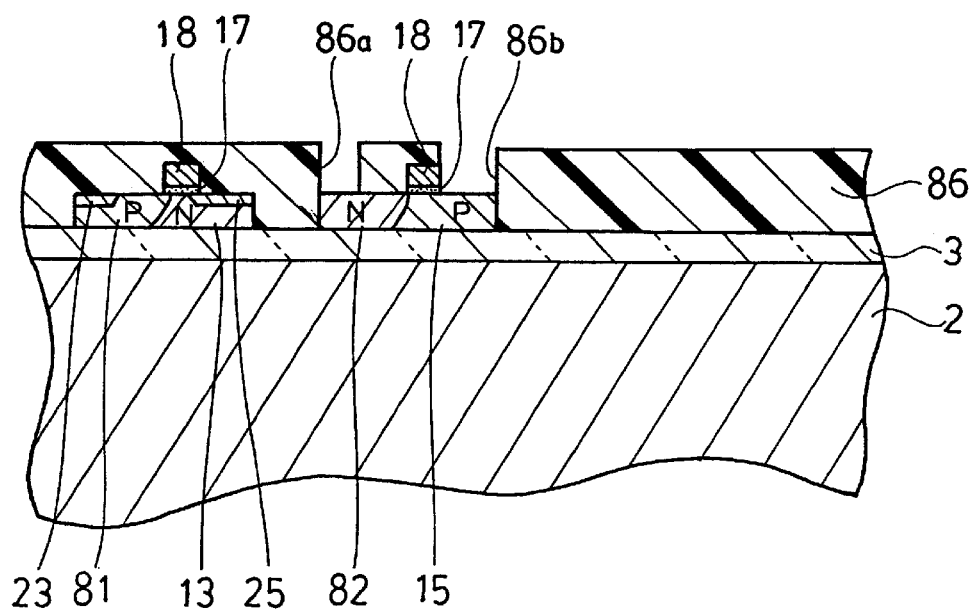

Then, using the photoresist 84 as an ion implantation barrier film, P impurities of which the conduction type is the same as that of the offset region 81 are selectively ion-implanted under conditions in the order of 25 keV in implantation energy and $3 \times 10^{15}$ cm$^{-2}$ in implantation dose, thereby making the P drain layer 23 and the P source layer 25 shown in FIG. 34. Boron atoms are used as the P impurities. Thereafter, the photoresist 84 is removed using sulfuric acid.

Then, a photoresist is again applied on the entire top face of the buried oxidation film 3 including the component regions and a photoresist 86 is patterned to form an opening 86a and an opening 86b, as shown in FIG. 34, respectively within a region where the drain layer of the N channel FET is formed and a region where the source layer thereof is formed in the later steps out of component regions.

Figure 35:
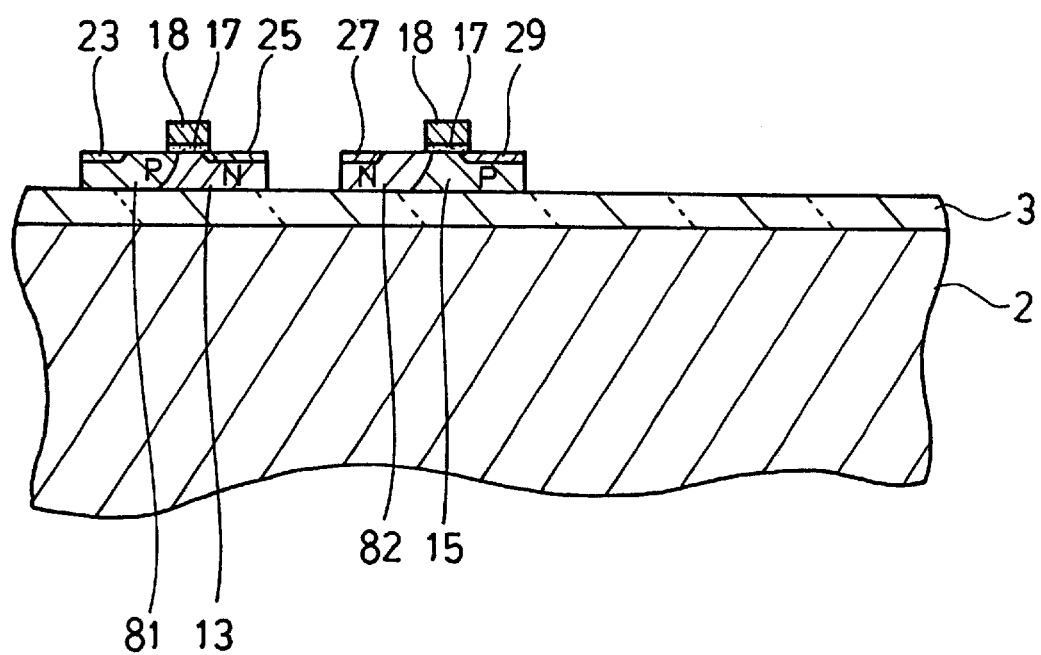

Then, using the photoresist 86 as an ion implantation barrier film, N impurities of which the conduction type is the same as that of the offset region 82 are selectively ion-implanted under conditions in the order of 40 keV in implantation energy and $3 \times 10^{15}$ cm$^{-2}$ in implantation dose, thereby making the N drain layer 27 and the N source layer 29 shown in FIG. 35. Phosphorus atoms are used as the N impurities. Thereafter, the photoresist 86 is removed using sulfuric acid.

Thereafter, the substrate contact hole 5, the heavily doped diffusion layer 7, the insulating film 39, the contact holes 31 and 6, the metal electrodes 21 and 22, the passivation film 40, the passivation film 40, and the connecting electrode 42 are formed in order in the same steps as those of the first embodiment which have been described with FIG. 12 to FIG. 21, thereby completing the semiconductor device 90 shown in FIG. 28.

Modification of the Fabricating Method

In the aforesaid first to third embodiments of the fabricating method of the semiconductor, the heavily doped diffusion layer 7 is formed by forming each gate electrode 18 of the semiconductor components (the P channel FET 33 and the N channel FET 35 in the first embodiment), the drain layers 23 and 27, and the source layers 25 and 29 within each component region on the buried oxidation film 3 of the SOI substrate 1, thereafter forming the substrate contact hole 5 in the buried oxidation film 3 and implanting the impurities of which the conduction type is the same as that of the support substrate 2 into the vicinity of the support substrate 2 exposed by the contact hole 5.

However, modifying the above, the heavily doped diffusion layer 7 may be formed by forming each gate electrode 18 of the semiconductor components within each component region on the buried oxidation film 3, thereafter forming the substrate contact hole 5 by selectively etching a predetermined region away from the component regions of the buried oxidation film 3, then forming the drain layer 23 and source layer 25 of P-type, and the drain layer 27 and source layer 29 of N-type respectively, and implanting impurities into the vicinity of the support substrate 2 exposed within the substrate contact hole 5 on implanting P-type or N-type impurities into the above layers.

Thereby, the heavily doped diffusion layer 7 can be formed by implanting the impurities of the same conduction type as that of the support substrate 2 into the vicinity of the support substrate 2 exposed within the substrate contact hole 5 simultaneously with implantation of the P impurities or the N impurities for forming the drain layer or the source layer of the semiconductor component. Accordingly, one step of implanting impurities can be omitted.

Furthermore, in aforesaid each embodiment, the contact hole 6 which is larger than the substrate contact hole 5, is formed by forming the substrate contact hole 5 in the buried oxidation film 3 of the SOI substrate 1 and the heavily doped diffusion layer 7 in the vicinity of the surface of the support substrate 2 exposed within the substrate contact hole 5, and thereafter forming the insulating film 39 on the buried oxidation film 3 and selectively etching the insulating film 39.

However, modifying the above, it is possible that the gate electrode, the drain layer, and the source layer of each semiconductor component are formed within each component region on the buried oxidation film 3 of the SOI substrate 1, and thereafter the insulating film 39 is formed on the entire top face of the buried oxidation film 3, a photoresist with an opening only at the formation region of the substrate contact hole is formed on the insulating film 39, and the insulating film 39 and the buried oxidation film 3 are selectively etching with the above photoresist as a mask in the same step to form a substrate contact hole which passes through to the support substrate 2, and the heavily doped diffusion layer 7 is formed in the vicinity of the surface of the support substrate 2 exposed within the substrate contact hole.

Effects of the Invention

As is clear from the aforesaid description, the semiconductor device according to the present invention can be provided with the metal electrode electrically connecting with the support substrate of the SOI substrate on the side of the component face of the semiconductor device and can be provided with the connecting electrode on the pad portion of the metal electrode, thereby connecting with the outside through the metal electrode. Accordingly, regardless of mounting method of the lead frame or the like of the package to the mounting substrate, the support substrate can be easily grounded or set at any bias, thus stabilizing the operation thereof.

Moreover, when the face up mounting method is employed for the mounting method, a multi-power circuit capable of properly using a plurality of voltage levels according to the situation can be constituted, thereby taking advantage in using the SOI substrate. When mounted by the face down mounting method, the support substrate can be easily grounded or set at any bias, thus preventing the potential of the support substrate from a floating state.

Furthermore, through the use of the method of fabricating the semiconductor device according to the present invention, the semiconductor device according to the present invention with such operation effects can be easily fabricated.

What is claimed is:

1. A method of fabricating a semiconductor device, comprising the steps of:

preparing an SOI substrate in which a surface silicon layer is formed above a support substrate made of silicon with a buried oxidation film therebetween;

forming a plurality of independent component regions made of the surface silicon layer by selectively etching the surface silicon layer;

forming a plurality of lightly doped P regions or N regions by selectively ion-implanting impurities atoms of which the conduction type is P-type or N-type into the plurality of component regions;

diffusing the impurity atoms in each lightly doped P or N region by heat treatment;

forming a gate electrode on each lightly doped P or N region with a gate oxidation film therebetween;

forming a substrate contact hole on the support substrate by selectively etching the buried oxidation film;

forming a drain layer, a source layer and a heavily doped diffusion layer by selectively ion-implanting impurity atoms of which the conduction type is opposite to that of the lightly doped P or N region into both sides of the gate electrode of each lightly doped P or N region, and by ion-implanting impurity atoms of which the conduction type is the same as that of the support substrate into a portion of the support substrate exposed within the substrate contact hole;

forming a component contact hole at a position independently corresponding to each drain layer and source layer of each component region by forming an insulating film on the entire top face of the support substrate and thereafter performing photo-etching treatment, and forming a contact hole also at a position corresponding to the substrate contact hole;

forming an independent metal electrode for each contact hole by forming a metal electrode layer on the entire top face of the insulating film and in all the contact holes and thereafter performing photo-etching treatment, and simultaneously forming a pad portion extending onto the insulating film at the metal electrode formed in the substrate contact hole.

2. The method of fabricating the semiconductor device according to claim 1, further comprising the steps of:

forming a protection film on the entire top face of the insulating film and each metal electrode, and forming an opening at a position in the protection film corresponding to the pad portion after said step of forming the metal electrode; and forming a connecting electrode connecting with the pad portion from the top of the protection film through the opening.

3. The method of fabricating the semiconductor device according to claim 1, wherein a contact hole larger than the substrate contact hole is formed at a position corresponding to the substrate contact hole in said step of forming a contact hole at a position corresponding to the substrate contact hole.

4. A method of fabricating a semiconductor device, comprising the steps of:

preparing an SOI substrate in which a surface silicon layer is formed above a support substrate made of silicon with a buried oxidation film therebetween;

forming a plurality of independent component regions made of the surface silicon layer by selectively etching the surface silicon layer;

forming a plurality of light doped P regions or N regions by selectively ion-implanting impurity atoms of which the conduction type is P-type or N-type into the plurality of component regions;

diffusing the impurity atoms in each lightly doped P or N region by heat treatment;

forming a gate electrode on each lightly doped P or N region with a gate oxidation film therebetween;

forming a lightly doped drain layer by selectively ion-implanting impurity atoms of which the conduction type is opposite to that of the lightly doped P or N region into both sides of the gate electrode of each lightly doped P or N region;

forming side walls made of silicon oxidation film on both side faces of each gate electrode;

forming a substrate contact hole on the support substrate by selectively etching the buried oxidation film;

forming a drain layer, a source layer and a heavily doped diffusion layer by selectively ion-implanting impurity atoms of which the conduction type is the same as that of the lightly doped drain layer into regions outside the side walls on both sides of the gate electrode of each lightly doped P or N region, and by ion-implanting impurity atoms of which the conduction type is the same as that of the support substrate into a portion of the support substrate exposed within the substrate contact hole;

forming a component contact hole at a position independently corresponding to each drain layer and source layer of each component region by forming an insulating film on the entire top face of the support substrate and thereafter performing photo-etching treatment, and forming a contact hole also at a position corresponding to the substrate contact hole;

forming an independent metal electrode for each contact hole by forming a metal electrode layer on the entire top face of the insulating film and in all the contact holes and thereafter performing photo-etching treatment, and simultaneously forming a pad portion extending onto the insulating film at the metal electrode formed in the substrate contact hole.

5. The method of fabricating the semiconductor device according to claim 4, further comprising the steps of:

forming a protection film on the entire top face of the insulating film and each metal electrode, and forming an opening at a position in the protection film corresponding to the pad portion after said step of forming the metal electrode; and forming a connecting electrode connecting with the pad portion from the top of the protection film through the opening.

6. The method of fabricating the semiconductor device according to claim 4, wherein a contact hole larger than the substrate contact hole is formed at a position corresponding to the substrate contact hole in said step of forming a contact hole at a position corresponding to the substrate contact hole.

7. A method of fabricating a semiconductor device, comprising the steps of:

preparing an SOI substrate in which a surface silicon layer is formed above a support substrate made of silicon with a buried oxidation film therebetween;

forming a plurality of independent component regions made of the surface silicon layer by selectively etching the surface silicon layer;

forming a plurality of lightly doped P regions or N regions by selectively ion-implanting impurity atoms of which the conduction type is P-type or N-type into the plurality of component regions;

diffusing the impurity atoms in each lightly doped P or N regions by heat treatment;

forming a gate electrode on each lightly doped P or N region with a gate oxidation film therebetween;

forming an offset region by selectively ion-implanting impurity atoms of which the conduction type is opposite to that of the lightly doped P or N region into one side of the gate electrode of each lightly doped P or N region;

diffusing the impurity atoms in the offset region by performing heat treatment;

forming a substrate contact hole on the support substrate by selectively etching the buried oxidation film;

forming a drain layer, a source layer and a heavily doped diffusion layer by selectively ion-implanting impurity atoms of which the conduction type is the same as that of the offset region into regions on both sides of the gate electrode of each lightly doped P or N region in the offset region, and by ion-implanting impurity atoms of which the conduction type is the same that of the support substrate into a portion of the support substrate exposed within the substrate contact hole;

forming a component contact hole at a position independent corresponding to each drain layer and source layer of each component region by forming an insulating film on the entire top face of the support substrate and thereafter performing photo-etching treatment, and forming a contact hole also at a position corresponding to the substrate contact hole;

forming an independent metal electrode for each contact hole by forming a metal electrode layer on the entire top face of the insulating film and in all the contact holes and thereafter performing photo-etching treatment, and simultaneously forming a pad portion extending onto the insulating film at the metal electrode formed in the substrate contact hole.

8. The method of fabricating the semiconductor device according to claim 7, further comprising the steps of:

forming a protection film on the entire top face of the insulating film and each metal electrode, and forming an opening at a position in the protection film corresponding to the pad portion after said step of forming the metal electrode; and forming a connecting electrode connecting with the pad portion from the top of the protection film through the opening.

9. The method of fabricating the semiconductor device according to claim 7, wherein a contact hole larger than the substrate contact hole is formed at a position corresponding to the substrate contact hole in said step of forming a contact hole at a position corresponding to the substrate contact hole.

* * * * *

UNITED STATES PATENT AND TRADEMARK OFFICE
CERTIFICATE OF CORRECTION

PATENT NO. : 6,358,782 B1
DATED : March 19, 2002
INVENTOR(S) : Takashi Masuda

It is certified that error appears in the above-identified patent and that said Letters Patent is hereby corrected as shown below:

Drawings,
Change "

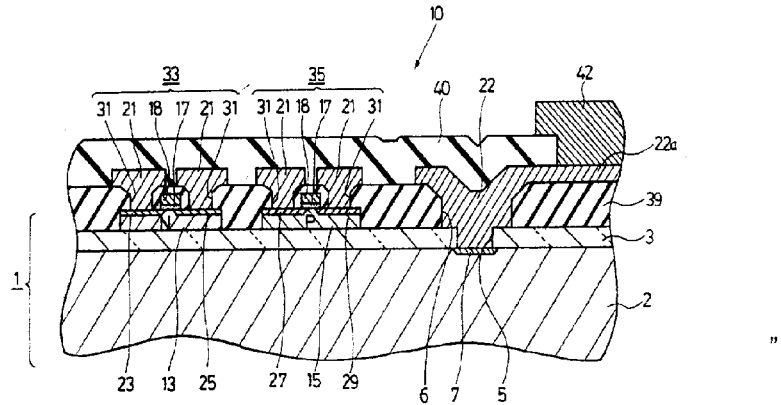

to be --

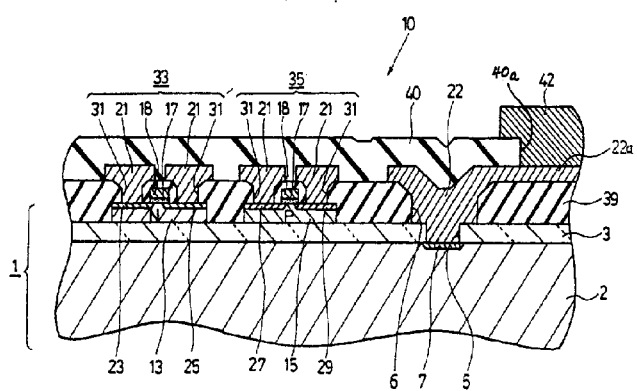

--

UNITED STATES PATENT AND TRADEMARK OFFICE
CERTIFICATE OF CORRECTION

PATENT NO.   : 6,358,782 B1
DATED         : March 19, 2002
INVENTOR(S)  : Takashi Masuda It is certified that error appears in the above-identified patent and that said Letters Patent is hereby corrected as shown below:

Change    "

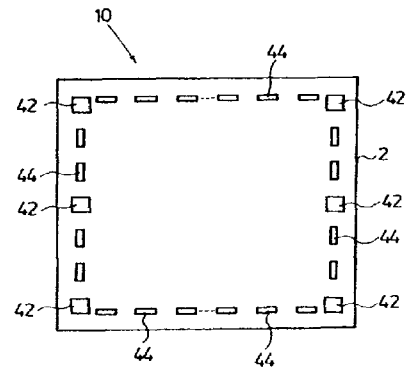

to be    --

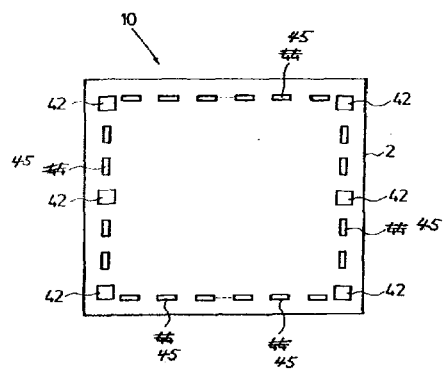

--

UNITED STATES PATENT AND TRADEMARK OFFICE
CERTIFICATE OF CORRECTION

PATENT NO. : 6,358,782 B1
DATED : March 19, 2002
INVENTOR(S) : Takashi Masuda

It is certified that error appears in the above-identified patent and that said Letters Patent is hereby corrected as shown below:

Change "

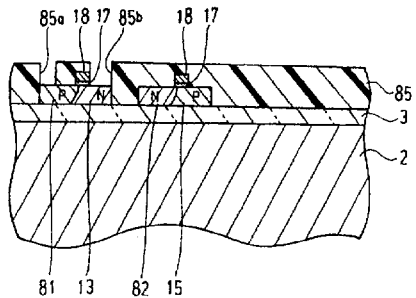

"

to be

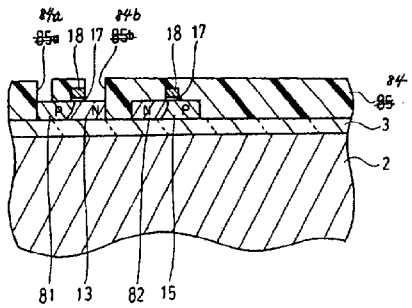

--

Signed and Sealed this

Thirtieth Day of July, 2002

*Attest:*

*Attesting Officer*

JAMES E. ROGAN
*Director of the United States Patent and Trademark Office*